(12) United States Patent
Schulz et al.

(10) Patent No.: US 11,305,998 B2
(45) Date of Patent: Apr. 19, 2022

(54) METHODS FOR MANUFACTURING CARBON NANOTUBE (CNT) HYBRID SHEET AND YARN BY GAS PHASE ASSEMBLY, AND CNT-HYBRID MATERIALS

(71) Applicant: University of Cincinnati, Cincinnati, OH (US)

(72) Inventors: Mark Schulz, West Chester, OH (US); Guangfeng Hou, Cincinnati, OH (US); Vianessa Ng, Miami, FL (US)

(73) Assignees: University of Cincinnati, Cincinnati, OH (US); North Carolina Agricultural & Technical State Univ, Greensboro, NC (US)

( * ) Notice: Subject to any disclaimer, the term of this patent is extended or adjusted under 35 U.S.C. 154(b) by 0 days.

(21) Appl. No.: 16/488,379

(22) PCT Filed: Feb. 23, 2018

(86) PCT No.: PCT/US2018/019427
§ 371 (c)(1),
(2) Date: Aug. 23, 2019

(87) PCT Pub. No.: WO2018/156899
PCT Pub. Date: Aug. 30, 2018

(65) Prior Publication Data
US 2020/0247675 A1  Aug. 6, 2020

Related U.S. Application Data

(60) Provisional application No. 62/463,407, filed on Feb. 24, 2017.

(51) Int. Cl.
*C01B 32/164* (2017.01)
*C01B 32/162* (2017.01)
(Continued)

(52) U.S. Cl.
CPC ............ *C01B 32/164* (2017.08); *B01D 39/06* (2013.01); *C01B 32/162* (2017.08); *C02F 1/001* (2013.01);
(Continued)

(58) Field of Classification Search
CPC . C01B 32/164; C01B 32/162; C01B 2202/22; B01D 39/06; B01D 2239/0258;
(Continued)

(56) References Cited

U.S. PATENT DOCUMENTS 5,816,509 A    10/1998 Ahn et al.
2005/0123467 A1  6/2005 Hartyunyan
(Continued)

FOREIGN PATENT DOCUMENTS

WO    2009110885 A1    9/2009
WO    2016087857 A1    6/2016

OTHER PUBLICATIONS

Yeonsu Jung et al., "Effect of polymer infiltration on structure and properties of carbon annotube yarms"; Carbon vol. 88, Feb. 26, 2015; pp. 60-69.
(Continued)

*Primary Examiner* — Krishnan S Menon
(74) *Attorney, Agent, or Firm* — Dinsmore & Shohl LLP

(57) ABSTRACT

Systems and methods for the gas-phase production of carbon nanotube (CNT)-nanoparticle (NP) hybrid materials in a flow-through pyrolytic reactor specially adapted to integrate nanoparticles (NP) into CNT material at the nanoscale level, and the second generation CNT-NP hybrid materials produced thereby.

43 Claims, 18 Drawing Sheets

(51) Int. Cl.
*B01D 39/06* (2006.01)
*C02F 1/00* (2006.01)
*D01F 9/12* (2006.01)
*H01B 1/04* (2006.01)
*H01L 41/18* (2006.01)
*B82Y 30/00* (2011.01)
*B82Y 40/00* (2011.01)

(52) U.S. Cl.
CPC ............... *D01F 9/12* (2013.01); *H01B 1/04* (2013.01); *H01L 41/183* (2013.01); *B01D 2239/0258* (2013.01); *B01D 2239/1208* (2013.01); *B82Y 30/00* (2013.01); *B82Y 40/00* (2013.01); *C01B 2202/22* (2013.01); *C01P 2002/85* (2013.01); *C01P 2004/02* (2013.01); *C01P 2004/03* (2013.01)

(58) Field of Classification Search
CPC ... B01D 2239/1208; C02F 1/001; D01F 9/12; H01B 1/04; H01L 41/183; B82Y 30/00; B82Y 40/00; C01P 2002/85; C01P 2004/02; C01P 2004/03; B01J 2204/005; B01J 2208/00769; B01J 2208/02; B01J 8/025; B01J 4/002; B01J 19/26; B01J 8/003; B01J 8/0035; B01J 10/007
See application file for complete search history.

(56) References Cited

U.S. PATENT DOCUMENTS

| 2011/0002837 | A1 | 1/2011 | Maghrebi et al. |
| 2013/0015122 | A1* | 1/2013 | Awadh ............... B01D 69/125 210/500.21 |
| 2013/0309473 | A1 | 11/2013 | Sundaram et al. |
| 2014/0186550 | A1 | 7/2014 | Cooper et al. |

OTHER PUBLICATIONS

Anthony Dichiara, "In situ diagnostics for the study of carbon nanotube growth mechanism by floating catalyst chemical vapor deposition for advanced composite applications"; Ecole Cnetrale Paris, Jan. 10, 2013, pp. 73-74.

* cited by examiner

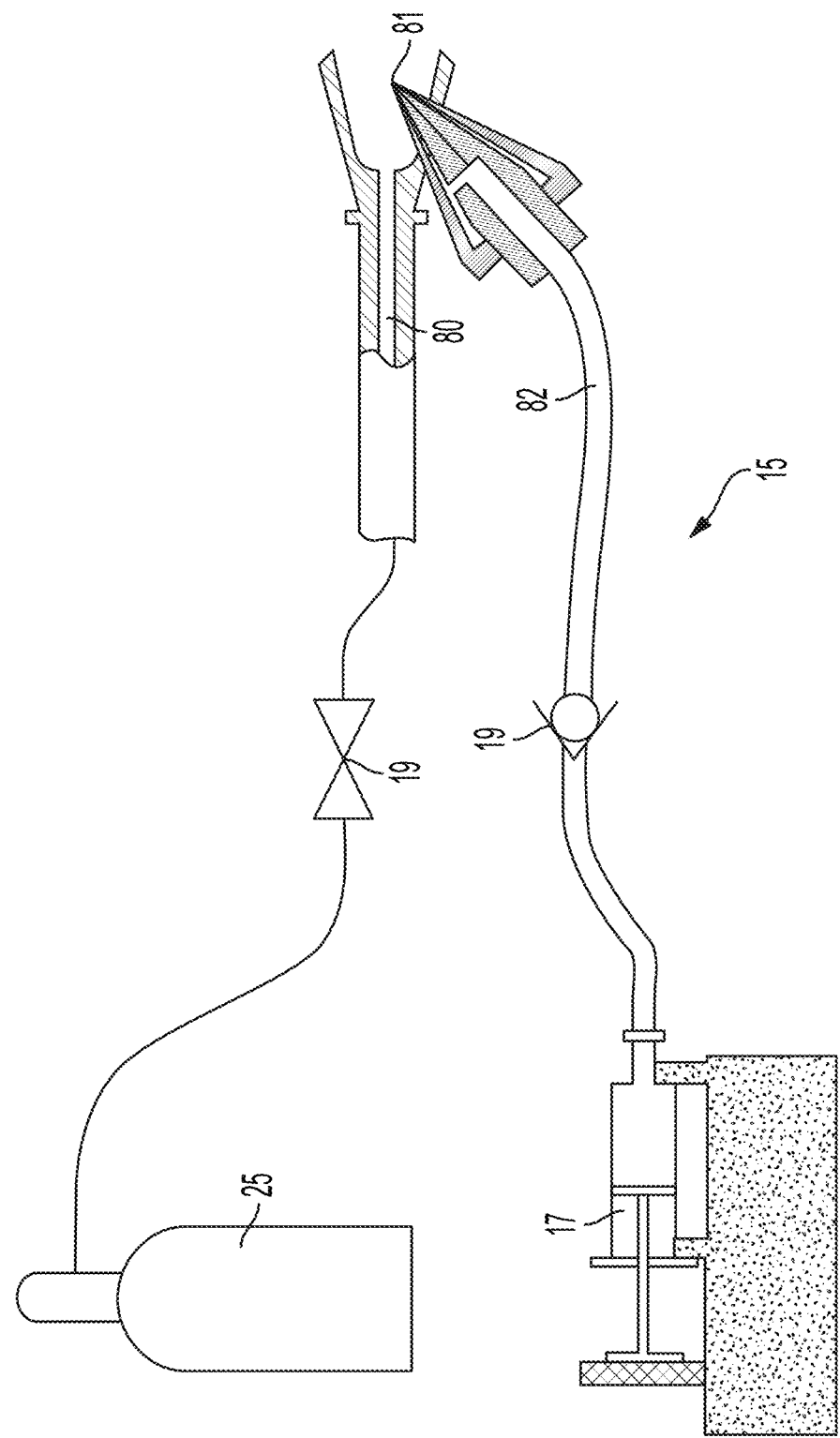

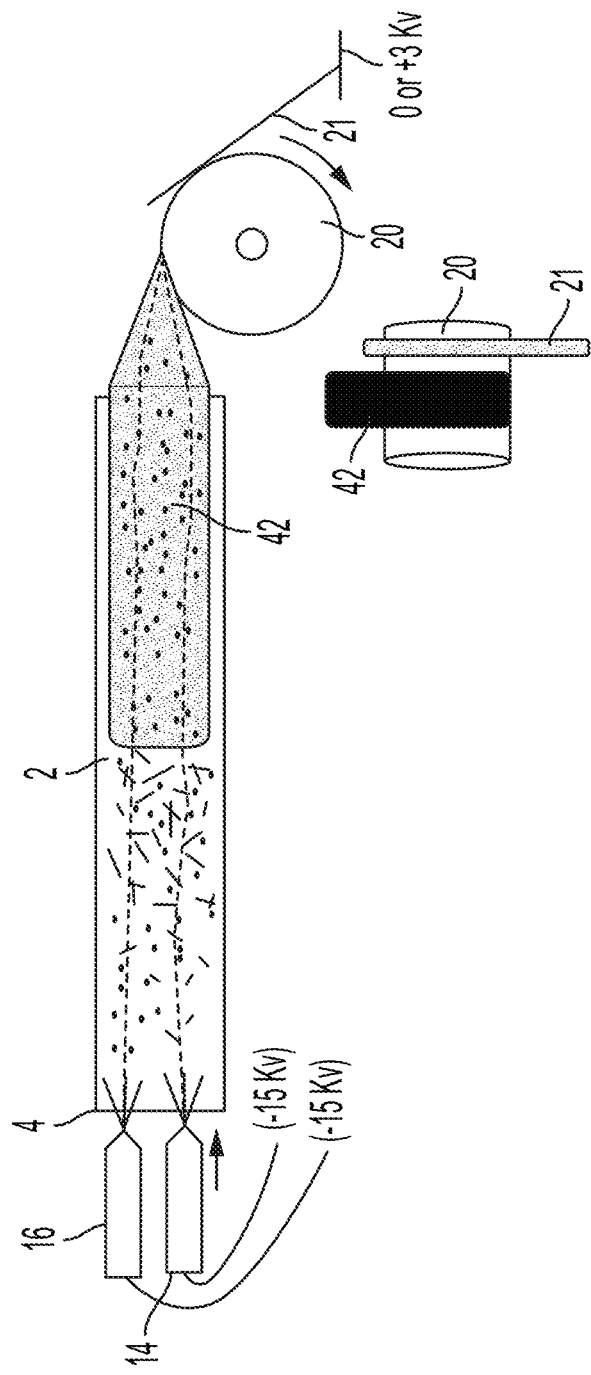
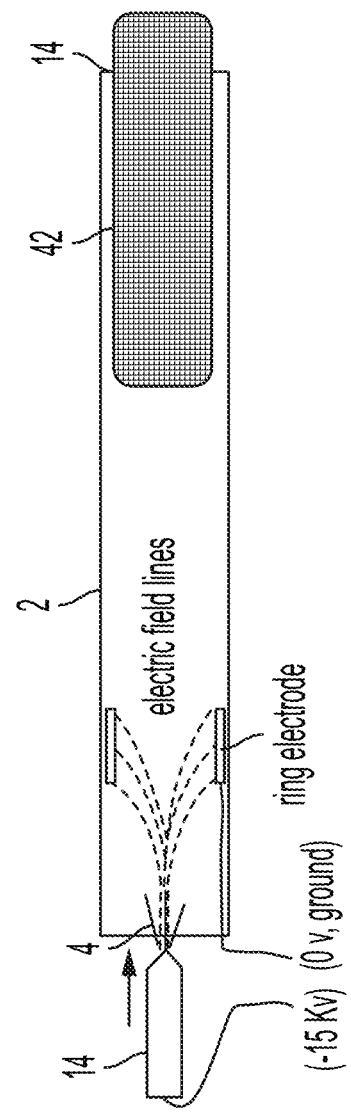

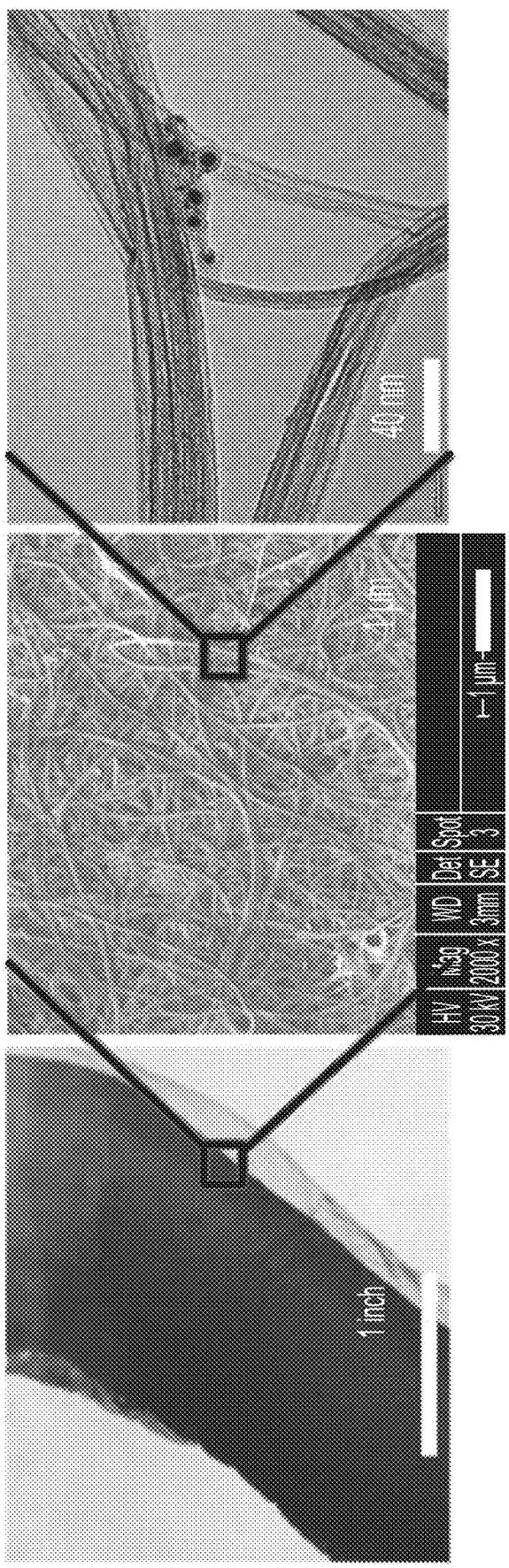

Fig. 13(a)
Fig. 13(b)
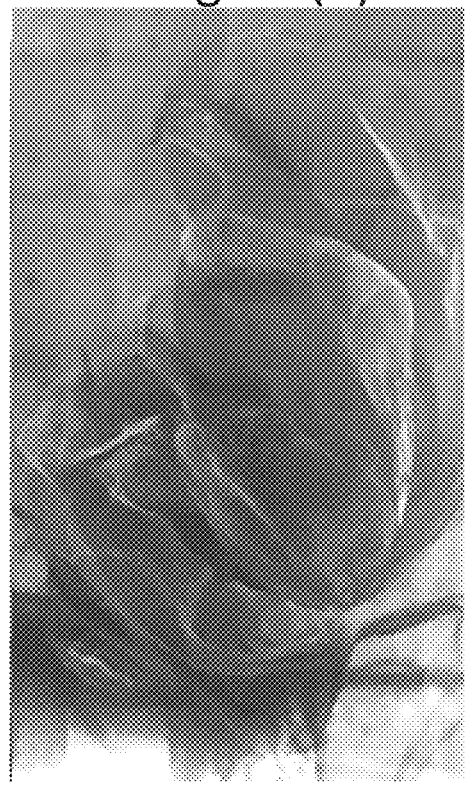
Fig. 13(c)
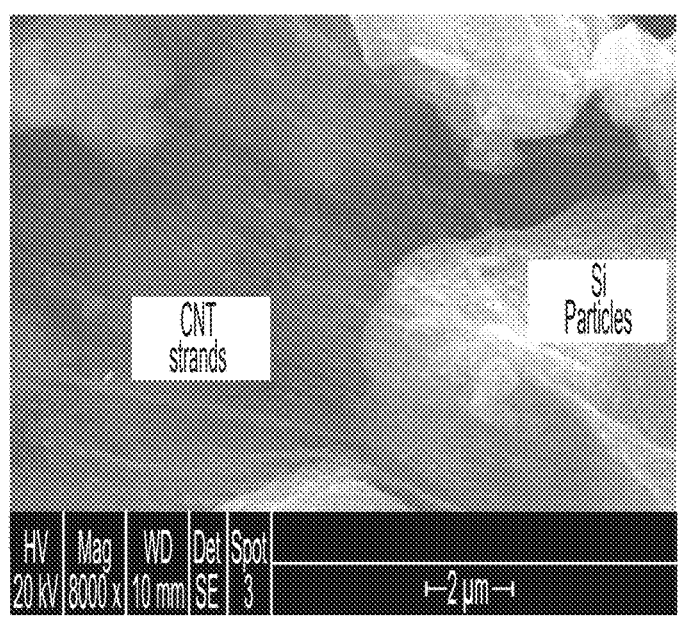
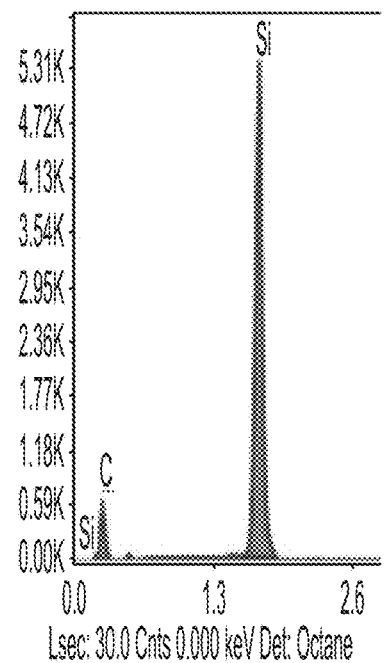

Fig. 14

Table 1

| Material | Conductivity (MS/cm) | Max current density MAmp/m² | Density (g/cm³) | Conductivity / Density MS/cm / g/cm³ | Conductivity / Density Relative to copper | Max current density / Density MA/m² g/cm³ | Max current density / Density Relative to copper | Strength | Cost |
|---|---|---|---|---|---|---|---|---|---|
| SWCNT | 1.0 | 4000 | 1.4 | 0.714 | 10.82 | 2857 | 1281 | high | high |
| MWCNT | TBS | | 1.4 | | | | | high | low |
| Spiral MWCNT | TBS | | 1.4 | | | | | high | low |
| Al NPs / Sheet | 0.377 | 16 | 2.7 | 0.14 | 2.12 | 5.9 | 2.7 | low | low |
| Carbon Fiber micro | .00063 | | 1.8 | .00035 | .005 | | | high | high |
| Carbon NanoFiber | TBS | | 1.5 | | | | | high | low |
| C60 | - | - | 1.65 | - | - | - | - | - | high |
| BNNT | small | small | 1.4 | small | 0 | small | 0 | high | very high |
| Gran. Act. Carbon | TBS | | 1.8 | | | | | - | low |
| Graphene | TBS | | 2.0 | | | | | - | high |
| Copper NPs | 0.595 | 20 | 8.96 | 0.066 | 1 | 2.2 | 1 | low | low |

Fig. 15

Table 2

| Particle Type | a | b | c | d | e | f | g | h |
|---|---|---|---|---|---|---|---|---|
| Heavy | 1.6 | 1.6 | 1.2 | 12 | 0 | 2 | 12 | 1.8 |
| Light | 1.5 | 1.2 | 0.9 | 14 | 1 | 1 | 24 | 1.8 |

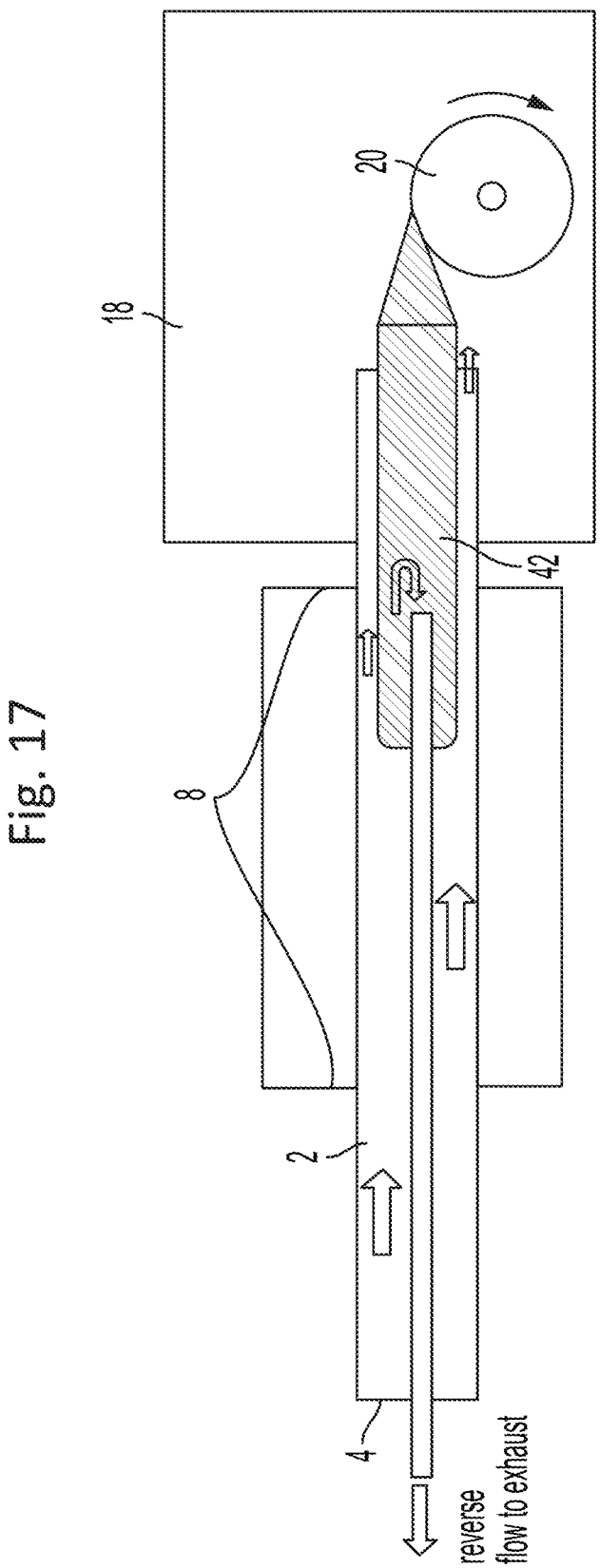

METHODS FOR MANUFACTURING CARBON NANOTUBE (CNT) HYBRID SHEET AND YARN BY GAS PHASE ASSEMBLY, AND CNT-HYBRID MATERIALS

PRIORITY CLAIM

This application claims priority to U.S. Provisional application Ser. No. 62/463,407, filed on Feb. 24, 2017, the entire disclosure of which is incorporated herein.

GOVERNMENT RIGHTS

This invention was made with government support under contract no. EEC-0812348 awarded by the National Science Foundation, contract no. N00014-15-1-27-73 awarded by the Office of Naval Research and contract no. T420H008423 awarded by the National Institute for Occupational Safety and Health. The government has certain rights in the invention.

BACKGROUND

Currently, carbon nanotubes (CNTs) and other nanoscale materials can be produced in powdered form industrially in large quantities. However, assembly of these nanoparticle (NP) powders into macroscale materials with tailorable properties has been a long-standing challenge in the field of nanotechnology. Presently, NPs are mainly dispersed in the liquid phase and used for example as additives to polymers. This provides only limited improvement in properties because individual particles do not bridge conductivity/load across the component. Another approach to assemble NPs is to filter a CNT-solvent under suction to form buckypaper, which has low strength because the nanotubes are not well entangled or aligned. Spraying a solution of NPs to form thin coatings is also known, but the coatings are not strong because the CNT are not entangled or aligned. A direct assembly approach is dry drawing/spinning to form sheet and yarn from nanotube forests. This is an expensive batch processing method; however it produces very pure material. Another method is to form a CNT sock (web) which is drawn/twisted to form sheet or yarn in the floating catalyst method, but the process as it has evolved to-date has limited throughput, and the formation of CNT socks integrated with other particles via the floating catalyst method has heretofore not been achieved.

Methods for effectuating large scale commercialization of nanoscale materials and methods for designing and assembling bulk nanoscale materials with specifically desired properties remain a compelling need in the art.

SUMMARY

Accordingly, embodiments of the invention provide novel methods for manufacturing CNT-hybrid sheet and yarn utilizing a scalable, high throughput gas phase assembly (GPA) system. Properties of the CNT-hybrid materials are more tailorable as compared to other approaches for producing sheet and yarn. A CNT-sock is formed using a pyrolytic reactor and the sock is directly used to produce the sheet and yarn material. In this way, liquid dispersion, which requires large volumes of liquid to disperse a small percent of nanotubes, is avoided, and multiple types of nanoparticles (NPs) such as metal and ceramic particles, single and multiwall carbon and boron nitride nanotubes, Cu nanowires, and C 60 can be combined in the process. Thermodynamically, the reactor provides appropriate conditions to form the sock, chemically the particles can be interspersed or joined, and a protective reducing/shielding atmosphere is provided for assembly so the NPs are not oxidized. Embodiments of the invention overcome the known challenges associated with dry dispersion of NPs into a pyrolytic reactor, the complexities associated with using multiple types of NPs, and the environmental health and safety concerns associated with handling NPs, such as ignition of NPs and the use of high voltages. A main challenge in developing a GPA method for CNT-hybrid material production has been that the injector and process conditions must be carefully set to produce the sock. Embodiments of the invention provide novel particle injection systems designed specifically for gas phase assembly in a pyrolytic reactor. The process is highly tunable and many material combinations have already been achieved. Embodiments provide new materials, for example, CNT-Cu electrical sheets and wires, CNT sheets infiltrated with chopped carbon fibers for laminated composites, and CNT sheets with graded porosity for water/air filtering.

Embodiments of the invention provide a system for the gas-phase production of carbon nanotube (CNT)-hybrid materials in a pyrolytic reactor, the system comprising: a flow-through pyrolytic reactor tube comprising a reactant inlet, an inlet zone, a furnace zone, an exit zone, and an exit port; a fuel injector positioned to deliver a fuel flow through the reactant inlet, said fuel flow comprising at least one carbon source, catalyst, and a carrier gas; at least one particle injector positioned to deliver a particle flow through the reactant inlet, said particle selected from a ceramic, a polymer, a metal, and combinations thereof; and a harvest box comprising at least one processing apparatus for receiving and processing the CNT-hybrid material as it exits the exit port. According to some embodiments, the fuel injector comprises a positive displacement mechanism and in some embodiments, the fuel injector and particle and at least one particle injector are independently controllable. Positive displacement fuel injection, in particular in the venturi injector at the inlet of the reactor allows independent control of the gas flow rate and the fuel flow rate and more precise tuning of the synthesis process. This helps to increase atomization of the fuel and increased the quality and electrical conductivity of the CNT sheet.

One embodiment provides particle injectors specifically designed for use in a pyrolytic reactor. According to one embodiment, the particle injector comprises a flow type particle dispenser comprising a canister configured to receive carrier gas flow and particles, a mixer for mixing the carrier gas and particles, and an injection nozzle, said injection nozzle positioned to deliver the gas particle mixture through the reactor inlet. According to another embodiment, the particle injector comprises a venturi eductor comprising a carrier gas flow inlet, a coupling port, a particle dispenser coupled to the coupling port, and an injection outlet, wherein the coupling port is aligned with a point of greatest constriction of the eductor, and the injection outlet is located proximate the reactor inlet.

According to another embodiment, a specially designed fuel injector for injecting fuel into a floating catalyst pyrolytic reactor is provided. The injector comprises a first nozzle for delivery of carrier gas at a first flow rate, and a second nozzle for delivery of fuel at a second flow rate, said first and second nozzles merging at a single outlet such that mixing of carrier gas and fuel occurs external to the outlet, further wherein the second nozzle comprises a positive displacement mechanism for independent control of the second flow rate.

Other embodiments provide gas phase methods for production of carbon nanotube (CNT)-hybrid yarn and sheets using a floating catalyst pyrolytic reactor tube comprising an inlet port, an inlet zone, a furnace zone, an exit zone, and an exit port, the method comprising: delivering an atomized fuel flow to the furnace zone at a point proximate the inlet port at a fuel flow rate, said fuel flow comprising a carrier gas, hydrocarbon, and at least one catalyst; delivering a particle flow to the furnace zone at a point in the inlet zone at or beyond the delivery point of the fuel flow at a particle flow rate, said particle flow comprising carrier gas and at least one particle selected from ceramic, polymer, metal, and combinations thereof; independently controlling the fuel flow rate and the particle flow rate to achieve a production time sufficient to continuously form a CNT-hybrid sock at a furnace zone temperature of between 1200° C. and 1600° C.; optionally, treating the sock as it emerges from the exit port; and collecting the emerging CNT-hybrid sock in a harvest box; wherein the collected CNT-hybrid sock comprises carbon nanotube bundles integrated with particles.

Still other embodiments provide CNT-hybrid materials produced by using embodiments of the inventive system and methods. Exemplary materials include CNT-hybrid sheets and yarns integrated with one or more of ceramic, polymeric and metallic nanoparticles.

These and additional embodiments will be further clarified by reference to the Figures and Detailed Description. Figures are provided to illustrate particular embodiments and aspects of the invention and should not be construed as limiting the full scope of the invention as defined by the appended claims.

BRIEF DESCRIPTION OF THE FIGURES

FIG. 4 Schematic depiction of a positive displacement fuel injector having the carrier gas flow separate from the fuel gas flow and under independent control with merging flow exterior to the injector.

FIG. 5(a) Schematic depiction of a portion of an exemplary system showing particle injector and fuel injector charging locations; FIG. 5(b) schematic depiction of fuel injector charging to electrodes in the reaction tube to increase particle dispersion.

FIG. 8(a) Depicts inch-scale CNT sock; FIG. 8(b) depicts μm-scale CNT network; FIG. 8(c) depicts nm-scale CNT bundles.

FIG. 13(a)-FIG. 13(c) show examples of socks formed using different kinds of particles; FIG. 13(a) left side is pristine CNT sock, while right side is CNT-Ag—Cu sock; FIG. 13(b) A CNT-Si sock useful as a battery electrode; FIG. 13(c) EDS showing C and Si as desired for the anode.

FIG. 14 Table 1: sets forth materials utilized in various illustrative GPA productions of CNT-hybrid materials.

FIG. 15 Table 2: sets forth exemplary relative position coordinates of the injectors as shown in FIG. 12 by particle size.

FIG. 17 Schematic of an embodiment of a reverse flow exhaust system removing gas from inside the sock while carrier gas passes from the outside to inside the sock.

DETAILED DESCRIPTION

Figure 1:
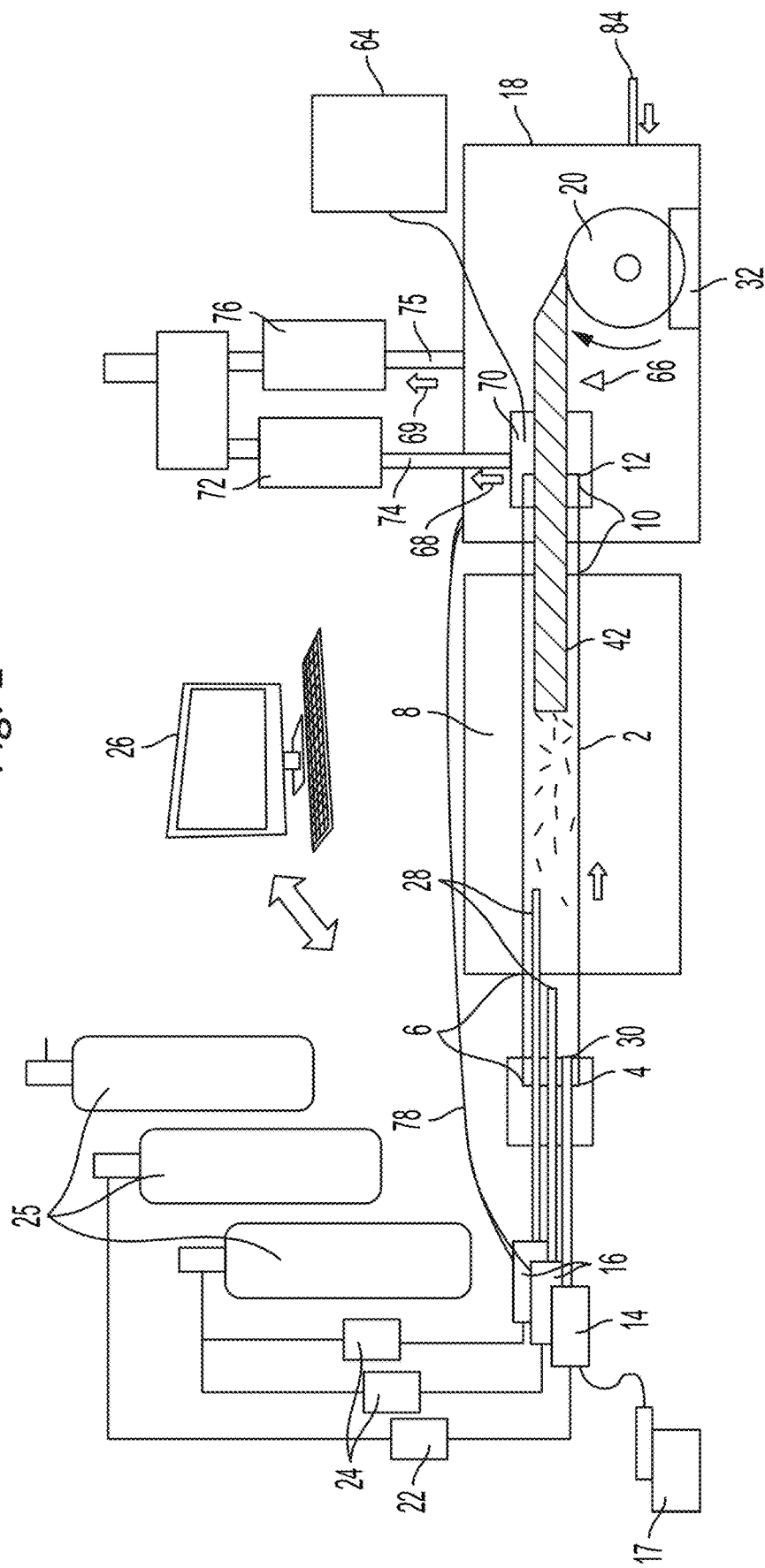
FIG. 1 Schematic depiction of an exemplary configuration of a system for the gas-phase production of carbon nanotube (CNT)-hybrid materials in a floating-catalyst pyrolytic reactor in accordance with embodiments of the invention.

While the specification concludes with the claims particularly pointing out and distinctly claiming the invention, it is believed that the present invention will be better understood from the following description.

There are three general classes of materials in the field of Materials Science; (i) Metals, (ii) Polymers, and (iii) Ceramics. Nanotubes (NTs), including carbon nanotubes (CNTs) and boron nitride nanotubes (BNNTs), are new single crystal materials. Nanoparticles (NPs), which are typically spheres and wires, are also newer materials corresponding to most of the hulk materials and their alloys. NTs and NPs can now be synthesized in large quantities industrially and have different or better properties than bulk materials. However, a long-standing problem in nanotechnology has been the difficulty in assembling the NTs and NPs into bulk materials like sheet and yarn. Embodiments of the invention provide novel systems and methods for the Gas Phase Assembly (GPA) of CNT and nanoscale materials into sheet and yarn in a high throughput process. Three classes of CNT-hybrid materials, which are analogues of traditional materials, can be manufactured by GPA: (i) CNT Metals (CNT-M: where M=Cu, Al, Ni, . . . ); (ii) CNT Polymers (CNT-P: where P=UHMWPE, C60, SWCNT, . . . ); and (iii) CNT Ceramics (CNT-C: where C=Diamond, Boron Nitride Nanotubes, Alum oxide, . . . ).

Although other investigators have developed and disclosed systems for the generation of nanoscopically aligned CNT yarns, tapes and sheets (e.g. U.S. patent publication no. 20150183642, the entire disclosure of which is incorporated herein by reference), the ability to generate CNT materials having nanoparticles integrated therein at the nano-structural level, is heretofore unknown, and may be achieved with embodiments of the specially designed systems, particle injectors, and fuel injectors as disclosed and claimed herein.

Embodiments of the invention provide a novel particle injector and injection system that are capable of introducing NPs into a gas phase pyrolysis reactor, GPA system embodiments, methods for the production of CNT-hybrid materials using the novel GPA system, and materials produced therefrom. The GPA system is highly tunable and a variety of material combinations (i.e. materials by design) are possible. GPA is based on van der Waals attraction and chemical reactions between CNTs and NPs.

Generally, a CNT-NP sock is formed in the reactor tube, and rolled into a sheet or twisted into yarn as it exits the reactor tube. Without wishing to be bound by theory, it is believed that van der Waals (vdW) forces control assembly of the sock. Bundles of CNT-NPs form a sock near the inner wall of the reactor tube under the influence of the flow field which is a balance of drag, pressure, and thermophoretic forces. The outlet end of the sock closes in the vortex region, and the CNT sock inflates. Entangled CNTs strengthen the sock which slides on the reactor wall. Electrostatic charging of the fuel/NPs may be utilized to repel CNT and keep them growing longer. Aspects of the disclosure provide novel injectors for fuel/particle atomization, electrostatically charging the gas/plasma for good dispersion, and specifically shaped reactor tubes to grow longer CNT. CNT-hybrid sheet and yarn materials may be provided with specifically tailored properties. This is done by modifying the gas phase pyrolysis method to include novel injection devices for the independently controllable injection of fuel and nanoparticles, with and without electrostatic charging. The method parameters are important based on the quality, throughput, and properties of the nanotube hybrid sheet and yarn manufactured.

In the CNT sock itself, CNTs exist in the form of bundles. Depending on the number of CNTs in the bundle, the diameter can range from 20 nm to 100 nm. Van der Waals (vdW) and Casimir attraction (a dynamic dipole attraction in neutral particles) can bridge different CNTs together and form bundles. Both vdW and Casimir forces are due to the electromagnetic mode fluctuations captured via the dielectric and magnetic response properties of the CNT. If the distance between CNTs is small (Angstrom to a few nm scale) where the retardation effects can be neglected, the vdW force is characteristic. The Casimir regime is for large enough distance (sub-μm and μm scales) where retardation effects become important. CNTs in bundles can be assumed to be in equilibrium with adhesion energy ~40 kT/nm for parallel CNTs, and ~56 kT per contact for perpendicular CNTs. Considering the hundred μm (even mm) long CNTs in the gas phase pyrolysis reactor, the adhesion forces inside the bundle are very strong. The interaction between different CNT bundles occur mainly at an angled contact rather than at a parallel configuration and the adhesion is weaker. However, because of the bundle's high aspect ratio ($10^2$-$10^5$), one CNT bundle can interact with thousands of other bundles and form a macroscale network. This network forms while the bundles undergo shear flow, which further induces the bundles to align and form a sock. Several significant parameters for CNT-hybrid sock formation include: (i) NPs with large aspect ratio; (ii) a high number density of NPs; and (iii) proper shear-induced alignment. NPs meeting these requirements can be successfully assembled into macroscale entities during this gas phase process.

Embodiments of the invention will now be disclosed and explained in part by reference to the figures. Numerical designators are used consistently throughout the figures and description to refer to the same unique elements. The figures are provided to illustrate specific embodiments and aspects and should not be construed as limiting the systems, methods, and materials as otherwise disclosed herein. The following numerical designators uniquely identify elements and aspects of the figures and are referred to in the description:

2 reactor tube
4 reactant inlet
6 inlet zone
8 furnace zone
10 exit zone
12 exit port
14 fuel injector
15 positive displacement fuel injector
16 particle injector
17 syringe
18 harvest box
19 independent adjusters
20 processing apparatus
21 flexible electrode
22 controller for fuel injector
23 grounding position
24 controller for particle injector
25 pressurized gas canisters with regulators
26 system controller/computer
28 delivery position of particle injector
30 delivery position of fuel injector
32 water bath
34 film/fiber feeder apparatus
36 exterior the reactant inlet
38 filter material
40 longitudinal axis of reactor tube
42 CNT material sock
44 flow-type particle dispenser
45 particle powder
46 canister
48 mixer
50 injection nozzle
52 eductor
53 carrier gas flow inlet
54 a pressure equalization port and tube
56 coupling port
58 particle dispenser
60 coupler
61 mixing vane
62 injection outlet
63 vena contracta 64 QMS
66 dispenser
68 by-pass exhaust
69 exhaust from harvest box
70 exhaust gas hood
72 bubbler
74 conduit from hood to bubbler
75 conduit from harvest box to bubbler
76 bubbler
78 pressure equilibrium hose
80 fuel injector first nozzle
81 merger point of first and second nozzle flow
82 fuel injector second nozzle
84 dilution gas flow
90 reverse flow exhaust system One embodiment of the invention provides a system for the gas-phase production of carbon nanotube (CNT)-hybrid materials in a pyrolytic reactor, the system comprising: a flow-through pyrolytic reactor tube 2 (e.g. a quartz tube, a ceramic tube such as mullite, or a metallic tube such as a FeCrAl tube, able to withstand pyrolytic temperatures) comprising a reactant inlet 4, an inlet zone 6, a furnace zone 8, an exit zone 10, and an exit port 12; a fuel injector 14 positioned to deliver a fuel flow through the reactant inlet 4, said fuel flow comprising at least one gaseous carbon source, optionally, at least one catalyst, and a carrier gas; at least one particle injector 16 positioned to deliver a particle flow through the reactant inlet 4, said particle selected from a ceramic, a polymer, a metal, and combinations thereof; a harvest box 18 comprising at least one processing apparatus 20 for receiving and processing the CNT-hybrid material as it exits the exit port 12. In some embodiments, the fuel injector 14 comprises a mass flow controller 22 for controlling the composition and flow rate of the fuel flow through the inlet 4, and the at least one particle injector 16 comprises a mass flow controller 24 for controlling the composition and flow rate of the particle flow through the inlet 4, each controller 22, 24 being operationally connected to a system controller 26 such that the controller 22 of fuel injector 14 and the controller 24 of the particle injector 16 may be independently or interdependently controlled.

Figure 12:
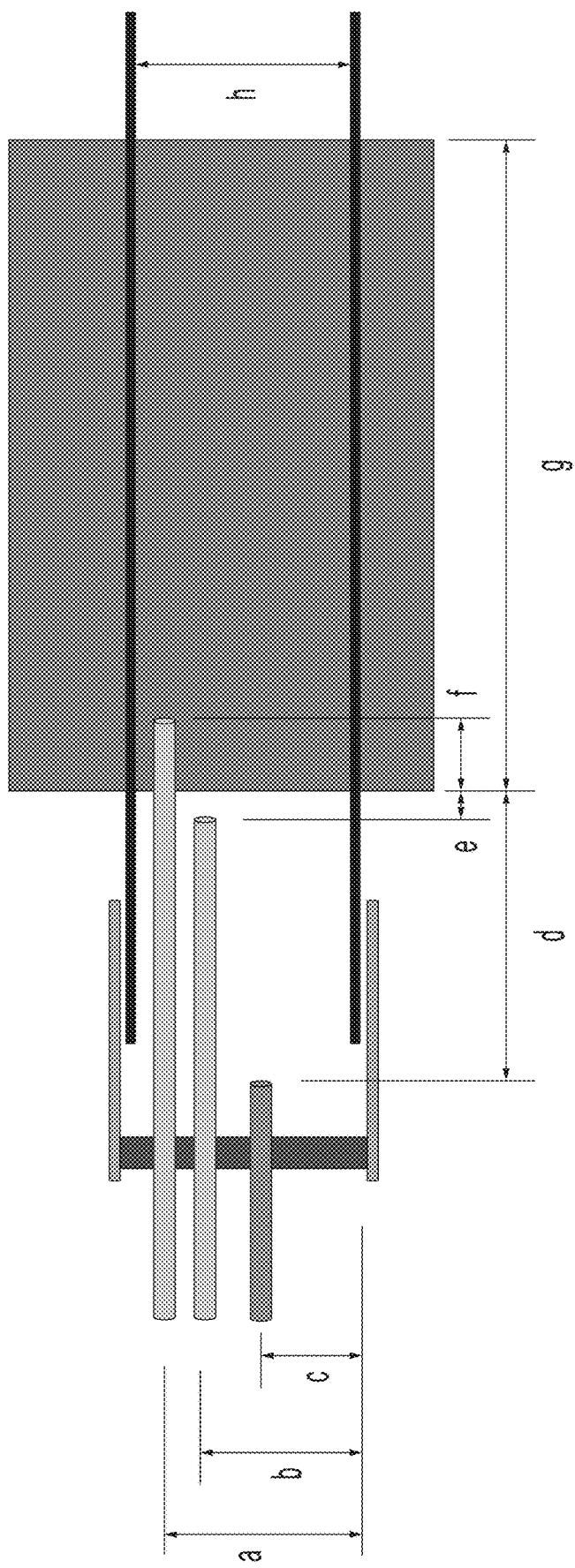
FIG. 12 Diagram setting forth relative exemplary injector positions for interpretation in conjunction with Table 2/FIG. 15.
Figure 16:
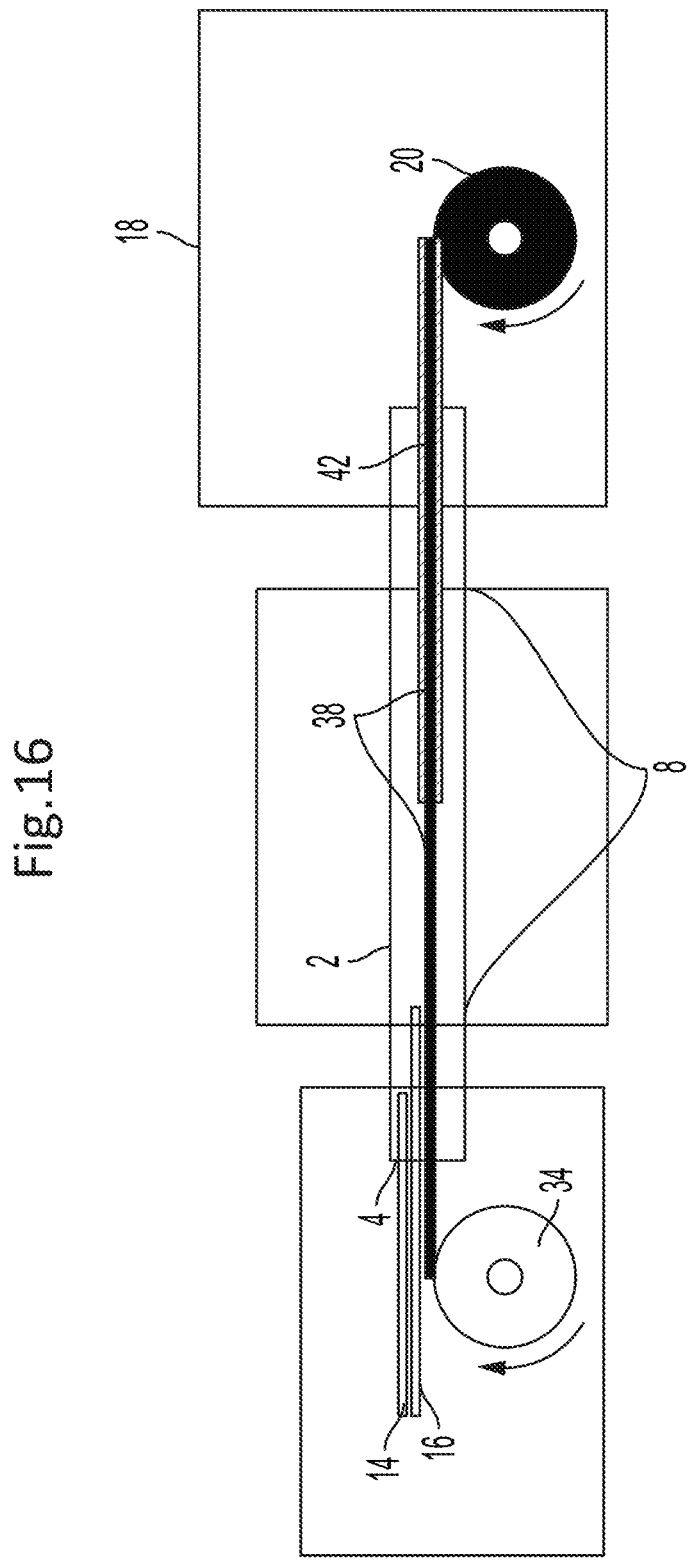
FIG. 16 Schematic of an embodiment of GPA designed to produce the CNT-hybrid material deposited on fiber tape showing continuous sock formation on the fiber at the rate the fiber exits the reactor tube exit port.

According to specific embodiments, a delivery position 28 of the particle injector 16 is closer to the furnace zone 8 than a delivery position 30 of the fuel injector 14. The fuel injector and particle injector are positioned to optimize the sock formation and to maximize the mass of NPs injected. The particle injector is forward of the fuel injector as illustrated in FIG. 12. The nominal positions of the injector are given in Table 2. The values in the table depend on the type of particles used and the type of properties desired. As an example, to produce high quality carbon nanotube (CNT) sheet (Raman G/D=100), the reactor length should be short, e.g. g=12 inches. To produce higher strength nanotube sheet and yarn, the reactor length should be long, e.g. g=24 inches.

Where a fuel injector is utilized, it may be controlled independently from the particle injector(s). The fuel injector delivers, for example, a gaseous carbon source, (e.g. a $C_{1-6}$ hydrocarbon, optionally hydroxylated, optionally substituted), optionally a catalyst (e.g. ferrocene) and carrier gas pressure (e.g. Argon). Optionally, hydrocarbon containing gas such as methane may be delivered with the particles and the separate fuel injector is not needed. An advantage of the hydrocarbon gas delivery is to leave more room in the inlet of the ceramic tube for reverse flow exhaust. Thiophene liquid may also be added to the fuel to promote nanotube growth. In a very specific embodiment, an alcohol, ferrocene and thiophene mixture is injected as a fine mist from the fuel injector. The alcohol cracks upon entering the furnace zone and releases C atoms and C fragments. The ferrocene vaporizes as it enters the furnace zone and releases pure Fe atoms. The Fe atoms form clusters a few nanometers in diameter. The carbon dissolves in the Fe NPs, precipitates out and nucleates a carbon nanotube (CNT). Billions of nanotubes are formed (grown) in the reactor continuously. The nanoparticles (NPs) injected by the particle injector interact with the CNT physically and/or chemically and alter the properties of the CNT.

One embodiment of the invention is directed to a novel fuel injector 14 for injecting fuel into a pyrolytic reactor tube 2, typically a ceramic reactor tube, for gas phase assembly of CNT-hybrid materials. The injector 14 comprises a first nozzle 80 for delivery of carrier gas at a first flow rate, and a second nozzle 82 for delivery of fuel at a second flow rate, said first 80 and second nozzles 82 merging at a single outlet 81 such that mixing of carrier gas and fuel occurs external to the outlet 81 further wherein the second nozzle 82 comprises a positive displacement mechanism for independent control of the second flow rate. In specific embodiments the positive displacement mechanism comprises a syringe 17.

Generally, the CNTs flow along the ceramic tube and assemble into small bundles of about ten nanotubes in the gas phase and the bundles assemble to form a sock with NPs integrated within the sock. The sock is wound onto a rotating drum, and the layers of CNT on the drum are densified by hydrophobic repulsion as the drum rotates through a water bath at the bottom of the drum. The gas mixture (argon, fuel, particles, and potentially other gases injected) passes through the reactor furnace zone in about 15 seconds time which varies with the flow rate.

The processing apparatus located at the exit port of the exit zone of the reactor tube may be a spool that winds and/or twist the emerging sock, or a rotating drum that rolls the emerging sock. According to specific embodiments, the processing apparatus 20 is selected from one or more of a rotating drum, a rotating spool, a spinner, a winder, a drawer, a stretcher, a compressor, and combinations thereof. According to specific embodiments, the processing apparatus comprises a rotating drum 20 and further comprises a water bath 32 positioned such that as the drum 20 rotates to wind the exiting CNT-hybrid material 42, the material passes through the water intermittently according to a rotational frequency.

According to other specific embodiments, the system further comprises a feeder apparatus 34 located exterior to the reactant inlet 4 and positioned to feed a fiber material 38 along a horizontal axis 40 of the reactor tube 2 to the processing apparatus 20 at a feeder rate corresponding to a rate of formation of the CNT-hybrid material 42 such that CNT-hybrid material deposits on the fiber material. In some aspects the fiber material 38 comprises a fiber cord or a fiber tape and the processing apparatus 20 is a spool or a drum, respectively, such that as the fiber cord or tape comprising deposited CNT-hybrid material exits the exit port 12 it is spun or rolled and compressed onto the spool or drum. The CNT forms in the reactor while the thin CF tape or other fibers or fiber tape is pulled through the high temperature reactor resulting in production of carbon fiber tape or material having CNT integrated with nanoparticles deposited over (or around) the tape. Any type of NP can be integrated into the process, and the CNT sock deposited onto the CF tape forms a completely integrated fiber composite. The stock fiber can be carbon fiber (CF), glass fibers (e.g. Kevlar™), metal wire or any fiber or wire or combination of fibers and wire that can withstand 15 seconds duration at 1400° C. in an inert gas environment.

The system contemplates inclusion of one or multiple particle injectors. Where multiple particle injectors are employed, they may be of the same or different type and may comprise particles according to size and dispersability. Different injector designs are more suitable for different sized particles. For example, smaller particles are strongly affected by van der Waals forces and are generally more difficult to inject. Smaller particles tend to agglomerate and thus are best injected using high pressure gas (Ar) flow in a venturi (e.g. FIG. 2(a)) that is also pressure equalized by a bleed tube to be near atmospheric pressure. A cannister holds and mixes (doses) the small or dense particles (e.g. Cu NPs). The pressure in the inlet to the venturi can be up to 60 psi typically. Low density/large particles, are not strongly affected by van der Waals forces, and are best injected using low pressure gas (Ar) flow in a low velocity tube that is also pressure fed by a large hole (e.g. FIG. 3). A cannister/hopper holds and mixes the light particles (e.g. granulated activated carbon, silicon, alumina, functionalized/passivated SWCNT and MWCNT). The pressure in the hopper can be up to 25 psi typically. Flow velocity is typically low, flow volume is high. For a given gas flow rate, a larger mass of particles can be injected using the flow injector than using the eductor/doser injector. Electrostatic charging helps to keep the particles separated. Functionalized and non-functionalize particles are used. If low density/small particles/sticky particles like SWCNT or ferrocene are injected into a high pressure passages or venturi, the tight packing of the particles and van der Waals forces can plug the small passages. Unintuitively, large particles flow through the passages without blocking while certain types of the small size particles tend to agglomerate and block injector passages.

In specific embodiments, a particle injector 16 designed for larger particles comprises a flow type particle dispenser 44 comprising a canister 46 configured to receive carrier gas flow and particles, a mixer 48 for mixing the carrier gas and particles, and an injection nozzle 50, said injection nozzle 50 positioned to deliver the gas particle mixture through the reactant inlet 4.

Figure 2A:
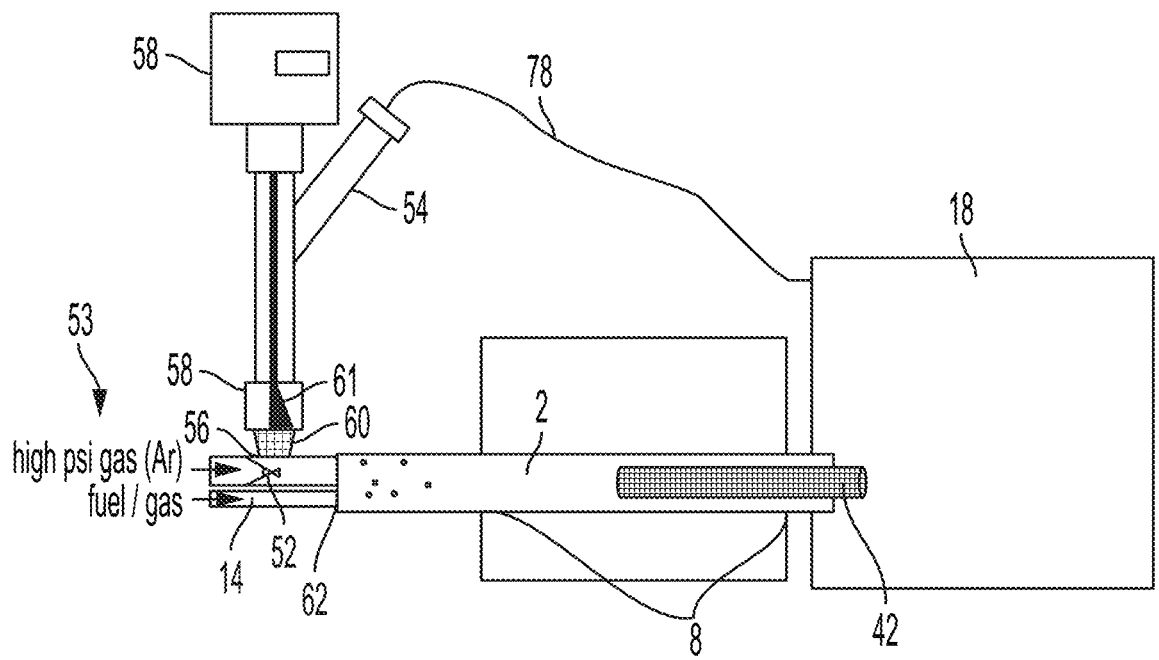
FIG. 2(a) Schematic depiction of a particle injector system of the venturi eductor type and its general positioning in a gas phase production system.
Figure 2B:
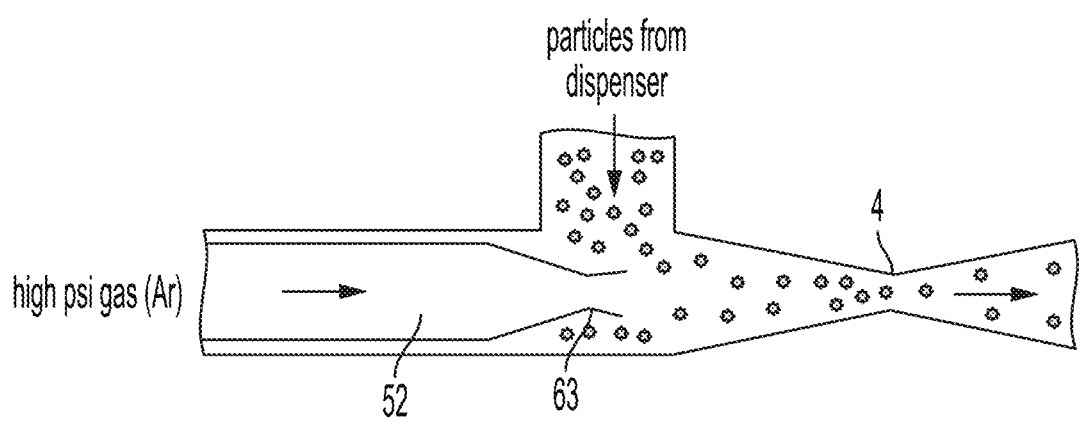
FIG. 2(b) an enlarged schematic of the eductor aspect of FIG. 2(a).

In other specific embodiments, a particle injector 16 comprises a venturi eductor 52 comprising a carrier gas flow inlet 53, a pressure equalization port and tube 54, a coupling port 56, a particle dispenser 58 coupled to a coupler 60 via the coupling port 56, and an injection outlet 62, wherein the coupling port 60 is aligned with a point of greatest constriction 63 (i.e. the vena contracta) of the eductor 52, and the injection outlet 62 is located proximate the reactant inlet 4. This type of particle injection system is sometimes referred to as a power feed system. The particle dispenser itself delivers dry nanoscale to microscale size powder at a low flow rate that can be adjusted depending on the size of the reactor tube, and the type of powder (size, density, shape). Nanoparticles must be delivered precisely at low feed rates. According to very specific embodiments, a delivery rate is 1-10 grams/minute when using a 2 inch diameter reactor tube with a total flow rate about 2-3 standard liters/minute (SLM). Different designs of power feed systems can be used for a suitable gas (non-liquid) inlet and dry powder (not suspended in a liquid). An illustrative dispenser, as shown in FIG. 2(a), may operate based on a rotating vane with holes at the bottom to dispense particles into the eductor funnel. The dispenser 58 is coupled to an eductor 52 via a coupler 60, for example, to couple glass tubing to pipe tubing and comprising a threaded plate, pipe, and reducer union. A suitable eductor is of the venturi type that accepts dry particles in a receiver such as top funnel shaped feeder. Gas (such as Ar) is input to the eductor and the suction at the vena contracta 63 (position in a venturi where the diameter of the gas stream is the smallest, and the fluid velocity and suction are greatest) draws in the particles from above. The particle dispenser delivery rate is adjusted to correspond with the pressure and flow rate of the inlet gas to properly disperse the particles in the outlet gas stream, and to prevent clogging of the eductor. According to very specific embodiments, a nozzle orifice diameter is 0.012 inch in the eductor, the inlet pressure is 10-30 psi, the inlet flow rate is 1-3 SLM (e.g. 20 psi inlet, 2.4 SLM flow), corresponding to a 2 inch diameter reactor tube with a total flow rate of 2-4 SLM. This results in a suction pressure (shut-off vacuum) of about 6 inches of mercury.

According to specific embodiment, the system comprises a pressure equilibration mechanism comprising at least one hose 78 connecting an interior of the harvest box 18 to an interior of a particle injector 16, said pressure equilibration mechanism sufficient to substantially equilibrate pressure throughout the system. In very specific embodiments, the mechanism comprises a tube that connects a hopper of the particle dispenser to the harvest box to prevent an air lock in the particle dispenser. The harvest box pressure should be about equal to the pressure in the reactor tube. Balancing the pressure in the reactor tube with the particle hopper enables more precise tuning of the gas flow rate into the eductor and more smooth and consistent injection of particles into the reactor tube. In some embodiments, the pressure in the harvest box is regulated by bubblers such that small changes in the inlet gas flow rate do not significantly affect the pressure in the harvest box or particle hopper.

Generally, the CNTs flow along the ceramic tube and assemble into small bundles of about ten nanotubes in the gas phase and the bundles assemble to form a sock with NPs integrated within the sock. The sock is wound onto a rotating drum, and the layers of CNT on the drum are densified by hydrophobic repulsion as the drum rotates through a water bath at the bottom of the drum. According to specific embodiments, the gas mixture (argon, fuel, particles, and potentially other gases injected) passes through the reactor furnace zone in about 15 seconds time which varies with the flow rate.

According to some embodiments, the fuel injector 14 comprises a positive displacement fuel injector 15, as shown in FIG. 4. A non-limiting example of a positive displacement mechanism is a syringe 17.

The furnace zone may be cylindrical about a longitudinal axis having a circular cross-section with a diameter; however in some embodiments the furnace zone of the reactor tube may have an ovate or rectangular cross-section. In other specific embodiments, the diameter increases or decreases along the axis toward the exit zone in a substantially funnel shape. According to preferred embodiments, the diameter decreases in the direction of the exit port. In very specific embodiments, the (e.g. ceramic) reactor tube 2 comprises a surface area to volume ratio of from about 1.3 to about 2, and comprises a circular, ovate, or rectangular cross-section.

The system may also be outfitted with one or more quadrupole mass spectrometers 64 to map chemical species present in one or more of the furnace zone 8, exit zone 10, and the harvest box 18 during a material production time. The QMS(s) may be operationally connected to the system controller to provide feedback which may be automatically processed to adjust tube-forming production parameters, for example, particle flow rate, fuel flow rate, exhaust gas attenuation bubbler pressure, and the like.

In some embodiments the system further comprising a dispenser 66 proximate the exit port 12 for spraying or injecting the CNT-hybrid material 42 with one or more of a silicone, a polymer and a solvent as it exits the exit port 12. For example, if the CNT-hybrid material comprises a CNT-alkali metal yarn or sheet, the material may be coated with a dialetric coating prior to removal from the harvest box.

Embodiments of the system preferably comprise an exhaust system, for example an exhaust gas by-pass system 68 comprising a collecting hood 70 disposed about at least a portion of the exit zone 10, at least one bubbler 72 located exterior to the harvest box 18 and in fluid communication with the collecting hood 70 via a tube 74, and at least one bubbler 76 located exterior to the harvest box 18 and in fluid communication with an interior of the harvest box 18, wherein the at least two bubblers 72, 76 are subject to independent or interdependent control by the system controller.

According to other embodiments, the exhaust system comprises a reverse flow exhaust system for removing gas from inside the sock 42 and passing it to outside the sock. Generally, the speed of the sock exiting the reactor depends on the flow of the gas inside the sock. With reverse flow, the speed the sock exits the reactor can be controlled within a range. The sock velocity can be reduced to increase the dwell time of the nanotubes in the reactor, enabling the growth of longer nanotubes and/or producing a thicker sock that can be directly wound onto a drum for use without the need to make tens or hundreds of layers of a thin sock to form a sheet. Reverse flow differs from the exhaust gas by-pass system in that by-pass mainly takes gas from the outside of the sock and feeds the gas to the bubbler and filter-exhaust system which reduces the concentration of hydrogen and flammable gases in the harvest box. According to preferred embodiments, a reverse flow and exhaust by-pass are used together to gain the greatest control over sock exit speed and to increase safety by reducing the concentration of hydrogen gas in the harvest box.

Electrostatic Fuel Injection EFI may be utilized in some embodiments to separate the fuel particles to reduce catalyst agglomeration and increase the yield of the process. Different carrier gases (i.e. Ar, N, He) were evaluated and it was determined that $Ar/H_2$ (g) provides the best spray because of its larger mass and ease to ionize and form plasma. In specific embodiments, 17,000 volts with a ceramic nozzle was used to charge the fuel. Some embodiments comprise electrically charging the fuel/gas and the NPs, and charging the reactor sock opposite to collect the NPs on the CNT. In some embodiments, the sock can be charged by applying an external AC field through external coils or by attaching an electrode to the rotating drum. The electric charging of the sock can attract nanotubes to the sock to align. An example is the nanotubes are charged to −15 kv in the particle injector, and the drum is charged to +3 kv. The CNT and sock will attach and align on the drum assisted by the electric field. The electric charge may assist in the synthesis of longer nanotubes and increase the yield of the reaction by keeping the CNT from agglomerating in the reactor tube. In some embodiments, the system further comprises at least one electrostatic charger for applying a voltage to one or more of the particle injector, the fuel injector 14, the reactor tube 2, and the processing apparatus 20. The fuel injector or the particle injector may be charged individually or together to improve dispersion and atomization of the fuel droplets or nanoparticles. Typical arrangements for charging are illustrated in FIG. 5.

For GPA production of CNT-NP hybrid materials, electrostatic charging of the NP and the fuel is manipulated to increase the nucleation efficiency and yield of the reaction and to improve dispersion of the NPs in the sock. NP constituents may include almost any material that will survive the synthesis process and the high temperature of 1400° C. Metals such as Cu melt and conform to the CNT and partly fill in the voids within the bundles of CNTs. Particles such as granular activated carbon (GAC) do not melt and pass through the process without change. Multiple types of NPs can be incorporated into the process at once. An example to provide high electrical conductivity and low cost, SWCNTs and Ag—Cu NPs can be introduced simultaneously. The process of electrostatic fuel and particle injection is new, and incorporating different types of NPs into the gas phase pyrolysis method has not been done before.

Embodiments of the invention also provide gas-phase methods for the production of carbon nanotube (CNT)-hybrid yarn and sheets using a pyrolytic reactor tube comprising an inlet port, an inlet zone, a furnace zone, an exit zone, and an exit port, the method comprising: optionally, delivering an atomized fuel flow to the furnace zone at a point proximate the inlet port at a fuel flow rate, said fuel flow comprising a carrier gas and at least one source of gaseous carbon; delivering a particle flow to the furnace zone at a point in the inlet zone at or beyond the delivery point of the fuel flow at a particle flow rate, said particle flow comprising carrier gas and at least one particle selected from ceramic, polymer, metal, a carbon source, and combinations thereof; independently controlling the fuel flow rate and the particle flow rate to achieve a production time sufficient to continuously form a CNT-hybrid sock at a furnace zone temperature of between 1200° C. and 1600° C.; optionally, treating the sock as it emerges from the exit port; and collecting the emerging CNT-hybrid sock in a harvest box. The collected CNT-hybrid sock comprises carbon nanotube bundles integrated with the injected particles.

According to very specific embodiments, the furnace zone temperature is maintained at about 1400° C. across the production time. According to embodiments that rely on a carbon gas flow without the use of a separate fuel, temperatures may be adjust to any whole number value between 900, and 1400° C., inclusive, depending on the material utilized and the material characteristics desired. The fuel may comprise any source of gaseous carbon. According to specific embodiments, the carbon comprises a $C_{1-6}$ alcohol. According to very specific embodiments, the fuel is made by combining methane and n-hexane in a 90:10 by volume ratio. 100 ml fuel, for example may be provided by mixing 90 ml methane with 10 ml n-hexane, adding 1 gm ferrocene and 0.3 ml thiophene, and ultra-sonicating the mixture in a water bath for at least about an hour.

Processing of the sock encompasses spinning the CNT NP sock into yarn, or drawing the sock into sheet, stretching the sheet for alignment, densifying the material using solvent, increasing the electrical conductivity of the material using acid treatment, and rolling the material. Rolling the exiting CNT sheet significantly increases the packing density of the CNT, which increases the tensile strength of the CNT Sheet. Upon rolling the CNT sheet, elongation (i.e. CNT alignment) is observed of 14% in the rolling direction, and the thickness decreases. CNT alignment is increased in the rolling direction. Embodiments provide rolling different CNT hybrid materials (such as CNT-Cu, CNT-Al, CNT-C60, CNT-SWCNT), and plying the thin sheets together to form thicker materials.

A rolling mill, for example, may be used to compact the CNT sheet with NPs to increase the density and therefore increase the electrical conductivity and strength. The emerging CNT-hybrid sock may be rolled, stretched, spun and/or twisted into sheets or yarn, and the selected processing may be accompanied by one or more of densification (for example by water or mechanical compressing or both) and electric charging (for example of the processing apparatus, e.g. rolling drum, spinning spool). According to one specific embodiment, the emerging CNT-hybrid sock is wound onto a rolling drum or a twisted onto a spool partially submerged in a water bath. According to some embodiments, the emerging CNT-hybrid sock is rolled with a backing sheet, tape or fiber. In very specific embodiments the backing sheet comprises a polytetrafluoroethylene, for example Teflon®.

In some embodiments a catalyst for the production of CNT is employed. A catalyst may be delivered in the fuel flow or the particle flow or both. The catalyst is selected from Fe, Ru, Co, W, Cr, Mo, Rh, Ir, Os, Ni, Pd, Pt, Ru, Y, La, Ce, Mn, Pr, Nd, Tb, Dy, Ho, Er, Lu, Hf, Li, Gd, and combinations thereof. In very specific embodiments, the catalyst is Fe. Fe catalyst may be delivered as a organometallic compound such as ferrocene or a ferrocenyl sulphide. The catalyst may be sulfur-containing and may be thiophene, iron sulphide, a sulphur-containing ferrocenyl derivative (eg ferrocenyl sulphide) or carbon disulphide. In very specific embodiments, the catalyst is ferrocene optionally together with thiophene or carbon disulphide. A specific Fe:S ratio is therefore optimized to promote CNT growth. Xylene may also be added to the fuel flow to enhance CNT sock formation.

According to some embodiments, the fuel flow carbon source comprises one or more alcohols selected from methanol, ethanol, and hexane. A carrier gas in accordance with embodiments of the invention may be any inert gas or combination thereof. In very specific embodiments the carrier gas is Argon due to its high density and ease to ionize. Optionally, $H_2$ may also be included in the carrier gas to reduce oxygen and promote nanotube formation. In specific embodiments the fuel flow rate is adjusted to between 10 ml/hr and 60 ml/hr, inclusive, for a 2 inch outer diameter reactor tube. The particle gas flow rate is adjusted to between 300 SCCM and 1200 SCCM, inclusive. The particle delivery rate depends on the type of particle injected, and may exceed the production rate of pristine CNT sock. Therefore, adding NPs can increase the yield of carbon hybrid material relative to the production rate of pristine CNT sock. According to very specific embodiments, t=The feedstock is prepared by dissolving ferrocene (0.5-2.0 vol %, Sigma-Aldrich) and thiophene (0.15-0.3 vol %, Sigma-Aldrich) in a 100 mL mixture of methyl alcohol (10 vol %, Fisher Scientific) and n-hexane (90 vol %, Sigma-Aldrich) aqueous solution.

The basis for GPA is that the motion of NPs in a gas is affected by thermophoretic, buoyancy, and flow forces, electrostatic forces, and van der Walls forces, but not significantly by gravitational forces. There is no requirement that nanotube synthesis be used to assemble NPs. Thus GPA without CNT synthesis is an aspect of the invention. This allows lower temperature materials to be assembled and simplifies the process by not requiring fuel and the pyrolysis reaction. According to some embodiments, CNT-hybrid materials may be produced without using fuel such that there is no independent fuel flow into the reactor. In such embodiments, the particle flow comprises carbon, for example, high aspect ratio carbon. The injected nanotubes or nanoparticles must be well-dispersed (and generally functionalized or passivated, e.g. 5% functionalization) in order to self-assemble into a sock. The functionalization or passivation may burn off if elevated temperature is used.

According to specific embodiments, ferrocene or other catalyst may be deposited onto powdered nanotubes (SWCNT, MWCNT, BNNT, CNT) or any NPs. The nanotubes or NPs with catalyst decoration are injected into the synthesis process along with fuel. New carbon nanotubes will grow on the injected nanotubes or NPs. The injected/new nanotubes or NPs will be integrated within the CNT sock from the floating catalyst synthesis process. Non-limiting examples of suitable carbon scaffolds include carbon nanotubes, carbon nanofibers, carbon microfibers, and C-60. Non-carbon NPs may be mixed with the high aspect ratio carbon particles in a particle injector, or delivered into the reactor inlet by different particle injectors. Ferrocene particles pulverized with granulated activated carbon (GAC) injected along with fuel but with no ferrocene catalyst in the fuel also produces a nanotube sock with a high concentration of GAC NPs.

An exhaust by-product of the formation of a CNT sock is hydrogen, which may impose a safety hazard. Some embodiments further provide for removal of hydrogen exhaust gas, for example by venting hydrogen outside the sock 42 through one or more openings in the exit zone 10 to a hood 70 at least partially surrounding the exit zone 10, and through a conduit 74 in communication with a first bubbler 72 located exterior to the harvest box, and/or by venting it through a reverse through mechanism (FIG. 17) directly from the interior of the sock 42 and/or by venting it from the harvest box 18 exterior to the harvest box, e.g., via a conduit 75 from the harvest box 18 to a bubbler 76 situated exterior to the harvest box. In some embodiment, a dilution gas flow 84 comprising carrier gas such as Argon, and in very specific embodiments purified Argon, is delivered to the interior of the harvest box 18 during production. In specific embodiments dilution gas flow into the harvest box is at a rate of from about 2 SLM to about 15 SLM.

According to specific method embodiments, hydrogen exhaust gas generated in the furnace is vented through one or more openings in the exit port to a hood at least partially surrounding the exit port, and through a conduit in communication with a first bubbler located exterior to the harvest box, hydrogen gas present in the harvest box is vented via a conduit from the harvest box to a second bubbler situated exterior to the harvest box, said first bubbler at a pressure of about 0.5 inches of water, said second bubbler at a pressure of about 1.0 inches of water and further comprising a dilution gas flow into the harvest box at a dilution gas flow rate of from about 2 SLM to about 15 SLM.

According to some embodiments, "delivering a particle flow" comprises injecting particles via at least one particle injector selected from a flow type injector, a venturi eductor, and combinations thereof, wherein prior to delivering the particle flow, the particles are mixed with the carrier gas in the at least one injector, and, optionally, applying a voltage to the particle injector. In specific embodiments particles may be delivered from at least two different particle injectors, which may be the same or different type of particle injector, each particle injector comprising different particles or combinations of particles. "Delivering an atomized fuel flow" and "delivering a particle flow" may be effectuated via a dual injection device comprising a first nozzle and a second nozzle that meet at a merged injection outlet, the first nozzle providing carrier gas and particles at a first flow rate, the second nozzle providing fuel at a second flow rate via a positive displacement pump, whereby the first flow rate and the second flow rate are independently controlled. According to specific embodiments, the positive displacement pump comprises a syringe.

Magnetic NPs such as iron can be attached to the growing CNT in GPA and a magnetic field can be used in the reactor to align the CNT in the axial or radial direction in the sock. Sheet and yarn can be produced form the sock. The oriented CNTs in the sheet or yarn will increase the properties of the material in the axial direction. According to some embodiments, a voltage between about −20 kV and +3 kV is applied to the dual injection device during a production time. According to very specific embodiments, an electromagnetic field is applied to the reactor during the production time in order to align CNT along the magnetic field due to eddy current forces. In some embodiments, an AC electromagnetic field is applied to the growing sock, "trapping" the CNT in the growth zone of the reactor, based on the principle of a magnetic bottle, and keeping the catalyst clean of amorphous carbon, enabling the nanotube to grow longer. In other embodiments, the CNT, which have iron catalyst particles, may also have additional magnetic particles injected to attach to the CNT. The CNT then can be aligned in the sock when the magnetic field is below the Curie temperature of the magnetic material.

The particles species set forth in column 1 of Table 3 may be incorporated into a CNT-hybrid sock utilizing embodiments of the novel system. However, a person of ordinary skill in the art will immediately recognize that many different CNT-hybrid materials are contemplated as within the scope of the invention, since the production of such materials wherein the NP is integrated into the CNT sock via gas phase assembly is heretofore unknown, in part due to the difficulty in achieving NP injection into the reactor tube, and the difficulty in achieving the requisite fine-tuned control of the production system as a whole. Having overcome the technical challenges associated with effectuating gas phase assembly of CNT-NPs in a pyrolytic tube by utilizing the inventive particle injectors and inventive systems as disclosed herein, the potential CNT-hybrid materials which may be produced is limited only by survival of the NP species in the reaction tube.

In specific examples, a CNT-hybrid material comprising a filter comprising a porosity defined by pore size and pore density is provided. The material comprises CNT bundles integrated with one or more particles selected from granulated activated carbon, epoxy resin and iron. Particles that do not atomize, but that provide pores in the CNT material when integrated into the CNT material are suitable for designing filters and pore size and density may be designed to be uniform or variable. Very specific examples of CNT-hybrid materials producible in accordance with embodiments of the methods disclosed herein include CNT-Cu wire, CNT-Al sheet, CNT-(Ag-coated-Cu) sheet, CNT-Si sheet, a magnetic CNT-Fe material, CNT-nitinol sheet, CNT-Y—X, wherein Y is selected from carbon nanofiber (CNF), carbon microfiber (CMF), and X is selected from the particles set forth in Table 3, CNT-X material, wherein X is selected from the particles set forth in Table 3, and more specifically where X is selected from one or more of lithium, sodium, potassium, rubidium, cesium, and francium, and, further coated with a dialetric coating, and CNT-X, wherein X is selected from one or more of Sc, Ti, V, Cr, Mn, Fe, Co, Ni, Cu, Zn, Y, Zr, Nb, Mo, Tc, Ru, Rh, Pd, Ag and Cd.

CNTs, as nanometer sized fibers with extremely high aspect ratio ($>10^1$), Young's modulus (~1 TPa) and tensile strength (~500 GPa), current carrying ability ($10^9$ A/cm$^2$), and thermal conductivity (3000 W/mK), have enormous potential for realization of various CNT-based functional materials and device applications. The intertwining and curvilinear attributes of the CNTs make them intrinsically stretchable and suitable for the fabrication of stretchable materials. In addition, ultrathin CNT films have shown excellent transparent-conductive performance and are most competitive candidates for the fabrication of highly transparent and stretchable electrodes. Reported examples include stretchable interconnects and electrodes based on ultrathin films and vertical aligned forests of CNTs embedded in elastomers, as well as super-growth CNTs dispersed in elastomer matrix. Furthermore, several CNT-based stretchable electronic and optoelectronic devices-organic light-emitting diodes (OLEDs), super capacitors, large area display's, thermo-acoustic loudspeakers, and field effect emitting device, have also been previously demonstrated. Currently utilized CNT-hybrid materials are formed by mixing as liquids, coating, compressing into hot sheets, or dispersing over the surface. System and method embodiments of the disclosed invention provide, for the first time. CNT material with nanoparticles integrated therein at the nanoscale level, and enable production of a powerful second generation of CNT-hybrid materials. The new materials may readily replace first generation materials in existing technology, but provide an opportunity to reach beyond these, as the scope/variety/functionality of the second generation materials is limited only by the thermal tolerances of the system.

Table 3 discloses a list of CNT-hybrid materials produced according to embodiments of the inventive methods, along with a non-limiting example of a contemplated downstream utility use. The entire disclosures of all cited references are incorporated by reference into this disclosure.

TABLE 3

| Particle species | CNT hybrid material | Downstream Applications |
|---|---|---|
| Li | CNT with Lithium (Li) sheet | Electrode, energy storage device, electrical conductor with greater specific conductivity than Cu, needs to be insulated from air and moisture in use. Reference [1] indicates that Li has desired properties for battery electrodes. A CNT-Li hybrid material has not been previously fabricated before to our knowledge. |
| Na | CNT with Sodium (Na) | Electrode, energy storage device. Reference [2] indicates that Na has desired properties for battery electrodes when used with a CNT binder. A CNT-Na hybrid material has not been previously fabricated before to our knowledge. |

TABLE 3-continued

| Particle species | CNT hybrid material | Downstream Applications |
| --- | --- | --- |
| K | CNT with Potassium (K) | Electronic devices, field-effect transistor. Reference [3] indicates that K has desired properties for electronic applications and field emission when used as a dopant with a CNT. The proposed CNH-K hybrid material has not been fabricated before to our knowledge. |
| Mg | CNT with Magnesium (Mg) | Reinforced composite materials. Reference [4] indicates that Mg is compatible with CNT when CNTs are added into Mg metal and suggests that inventive GPA synthesis as disclosed for integrating CNT and Mg is achievable. Oxygen level must be very low to prevent burning of Mg. The proposed CNT-Mg hybrid material has not been fabricated before to our knowledge. |
| Ca | CNT with Calcium (Ca) | High-capacity hydrogen storage, electrical conductor. Reference [5] indicates based on theory that Ca is useful to combine (decorate on the outside) with CNT to store hydrogen. The proposed CNT-Ca hybrid material has not been fabricated before to our knowledge. |
| Ba | CNT with Barium (Ba) | Low-work function thermionic cathodes. Reference [6] indicates that Ba is useful to functionalize multi-wall powder CNT for use as thermionic cathodes. The proposed CNT-Ba hybrid material has not been fabricated before to our knowledge. |
| Ti | CNT with Titanium (Ti) | High performance alloy. Reference [7] indicates that Ti is useful for coating powder CNT. Applications include photochemical processes for energy generation and to remove carbon dioxide from the environment, and $TiO_2$ for water filtration. The proposed CNT-Ti hybrid material has not been fabricated before to our knowledge. |
| Zr | CNT with Zirconia (Zr) | High performance alloy. Reference [8] indicates that Zr is useful to combine with CNT to improve several properties of CNT. The proposed CNT-Zr hybrid material has not been fabricated before to our knowledge. |
| Nb | CNT with Niobium (Nb) | Superconducting electrodes. Reference [9] indicates that Nb is useful combine with CNT for use as electrical devices and superconducting material. The proposed CNT-Nb hybrid material has not been fabricated before to our knowledge. |
| Cr | CNT with Chromium (Cr) | Corrosion resistance materials. Reference [10] indicates that Cr is useful for coating CNT. The proposed CNT-Cr hybrid material has not been fabricated before to our knowledge. |
| Ni | CNT with Nickel (Ni) | Smart materials, high performance alloy, catalyst for nanotube growth. Ni is useful combine with CNT for use as superconductor and electrical devices. Ni is also a catalyst and can be used to grow CNT. The proposed CNT-Ni hybrid material has not been fabricated before to our knowledge. |
| Pd | CNT with Palladium (Pd) | Hydrogen storage devices. Reference [11] indicates that Pd is useful to mix with CNT powder to from a binder for hydrogen storage. The proposed CNT-Pd hybrid material has not been fabricated before to our knowledge. |
| Cu | CNT with Copper (Cu) and other metals for electrical conduction, can be particles or nanowires | Conductor, electrical device, experimental results and microscopy imaging. Reference [12] indicates that Cu is useful to combine with other metals and CNT for use as electrical conductors. The reference showed this using simulation and a solder type material. Since carbon is not soluble in Cu, the alloy will be soluable and allow the metal to wet the CNT and improve electrical conductivity. The proposed CNT-Cu-alloy (alloy can be Fe, Ni, Co, other transition metals) hybrid material has not been fabricated before to our knowledge. |
| Al | CNT with Aluminum (Al) (alloyed) | Reinforced composite materials, electrical and thermal conductors. Reference [13] indicates that Al is useful to combine with CNT for use as electrical conductors and devices. The reference added CNT powder to Al using induction heating and melting. The proposed CNT-Al hybrid material has not been fabricated before to our knowledge. |
| Ag coated Cu | CNT with Ag coated Cu platelets | Increase electrical conductivity and reduce electrical anisotropy, experimental results show testing of laminated CNT-Al sheet. |
| Si | CNT with Si microparticles or nanoparticles | Anode for Li—Si battery, CNT is the electrode and eliminates any binder, reduces breaking and possibly the solid-electrolyte barrier, microscopy imaging shows the structure of the novel sheet with GAC microparticles. |

TABLE 3-continued

| Particle species | CNT hybrid material | Downstream Applications |
|---|---|---|
| GAC | CNT with granulated activated carbon (GAC) particles | Controls the porosity, capillarity, and breathability of CNT sheet, the GAC also filters toxic chemicals and particles from air and water. Experimental testing of sheet for water filtration and flame retardancy of CNT GAC has been performed. |
| GAC + ferrocene | CNT with GAC and ferrocene | Produces sheet and increases yield, GAC and ferrocene produced sheet without any catalyst in the fuel, GAC-Ferrocene was used with catalyst in fuel to increase throughput of the reaction. CNT GAC sheet using pulverized ferrocene particle injection with GAC has been produced by the novel GPA methods. |
| CNT | CNT with powder CNT injected | This will allow low cost SWCNT to be integrated into CNT sheet to increase the yield and reduce the cost. |
| BNNT | CNT with BNNT powder injected | This will allow injecting BNNT on the surface with CNT inside to provide greater flame resistance to fabric and provides a functionally graded material that is produced using two particle injectors in the process. BNNT also provide protection from radiation. A garment can be formed to protect from Nuclear Magnetic Pulse radiation and heat. |
| C-60 | CNT with buckyballs | Simulation indicates that small conductors between junctions of CNT may aid electrical and thermal conduction. |
| Nitinol | CNT with Nitinol | Produces a smart material that is an electrical conductor with shape memory alloy properties. |
| Cu/Ni | CNT-Cu—Ni | The alloy of Cu and Ni provides good electrical conductivity and good wetting of carbon. |
| Fe | CNT-Fe | This is a way to add catalyst to the reaction in the form of adding metallocenes to increase the yield of the reaction. A larger quantity of Fe will also make the CNT have magnetic attraction. |
| $C^{13}$ (g) | CNT with $C^{13}$ injected as a gas | Use as a radioactive tracer for medical applications. |

Functionalization and passivation of the nanoparticles also affects their disperse-ability and properties of the sheet and yarn materials. The present process is readily distinguishable from processes reliant on decorating nanotubes with particles after the nanotubes have been synthesized. The references below, all of which are incorporated herein by reference, indicate that combining different materials with nanotubes is feasible and provides useful properties. CNT hybrid material produced according to the inventive methods disclosed herein is a new material synthesized by a novel process capable of integrating many materials with carbon and carbon nanotubes. The difference between CNT hybrid materials and materials produced using other processes is that the CNT hybridization method occurs during the synthesis process when the CNT are being formed, and thus the integration of CNT and particles occurs at the nanoscale. Microscopy demonstrates the nanoscale distribution of particles and films, which is a different material structure from other techniques that coat nanotubes or incorporate nanotubes into a molten metal. The properties of the resulting material will also be different and improved since the CNT and alloy or ceramic or polymer material are better integrated as opposed to decorating particles onto nanotubes after the nanotubes are formed.

REFERENCES FOR TABLE 3

1. Nomura, A., Ito, K. & Kubo, Y. CNT Sheet Air Electrode for the Development of Ultra-High Cell Capacity in Lithium-Air Batteries. Sci. Rep. 7, 1-8 (2017).
2. Yin F, Liu Z, Yang S, et al. Na$_4$Mn$_9$O$_{18}$/Carbon Nanotube Composite as a High Electrochemical Performance Material for Aqueous Sodium-Ion Batteries. Nanoscale Research Letters. 2017; 12:569. doi:10.1186/s11671-017-2340-1.
3. Radosavljević, M., Appenzeller, J., Avouris, P. & Knoch, J. High performance of potassium n-doped carbon nanotube field-effect transistors. Appl. Phys. Lett. 84, 3693-3695 (2004).
4. Han, G. Q. et al. The influence of CNTs on the microstructure and ductility of CNT/Mg composites. Mater. Lett. 181, 300-304 (2016).
5. Lee, H., Ihm, J., Cohen, M. L. & Louie, S. G. Calcium-decorated carbon nanotubes for high-capacity hydrogen storage: First-principles calculations. Phys. Rev. B—Condens. Matter Mater. Phys. 80, 1-5 (2009).
6. Xiao, L. et al. Barium-functionalized multiwalled carbon nanotube yarns as low-work-function thermionic cathodes. Appl. Phys. Lett. 92, 90-93 (2008).
7. Omidvar, H., Mirzaci, F. K., Rahimi, M. H. & Sadeghian, Z. A method for coating carbon nanotubes with titanium. Xinxing Tan Cailiao/New Carbon Mater. 27, 401-408 (2012).
8. Mazaheri, M., Mari, D., Hesabi, Z. R., Schaller, R. & Fantozzi, G. Multi-walled carbon nanotube/nanostructured zirconia composites: Outstanding mechanical properties in a wide range of temperature. Compos. Sci. Technol. 71, 939-945 (2011).
9. Pallecchi, E., Gaaß, M., Ryndyk, D. A. & Strunk, C. Carbon nanotube Josephson junctions with Nb contacts. Appl. Phys. Lett. 93, 7-9 (2008).
10. Tseluikin, V. N. & Kanaf'eva, O. A. Preparation and Properties of Composite Chromium-Carbon Nanotube Coatings. Chem. Pet. Eng. 51, 54-57 (2015).
11. Das, T., Banerjee, S., Dasgupta, K., Joshi, J. B. & Sudarsan, V. Nature of the Pd-CNT interaction in Pd nanoparticles dispersed on multi-walled carbon nanotubes and its implications in hydrogen storage properties. RSC Adv. 5, 41468-41474 (2015).

12. Milowska, Karolina & Ghorbani-Asl, Mandi & Burda, Marek & Wolanicka, Lidia & Catic, Nordin & Bristowe, P. D. & Koziol, Krzysztof. (2017). Breaking the Electrical Barrier between Copper and Carbon Nanotubes. Nanoscale. 9. 8458-8469. 10.1039/C7NR02142A.
13. Mansoor, M. & Shahid, M. Carbon nanotube-reinforced aluminum composite produced by induction melting. J. Appl. Res. Technol. 14, 215-224 (2016).

EXAMPLES

Example 1

This example illustrates production of a CNT-Cu wire and design of an electrical conductor material therefrom.

A CNT-Cu hybrid sock is produced by an embodiment of the inventive GPA floating catalyst pyrolytic system. The production parameters are as follows:
(i) Ar flow rate to fuel injector 1200 SCCM;
(ii) Ar flow rate to particle injector 800 SCCM;
(iii) Hydrogen shroud gas flow rate 100 SCCM;
(iv) fuel injector fuel flow rate 30 ml/hr;
(v) furnace zone temperature 1400 C;
(vi) particle type 25 nm C coated Cu;
(vii) fuel injector position from furnace zone, 14 inches;
(viii) particle injector position from furnace zone, 2 inches;
(ix) Ar dilution gas flow rate into harvest box, 2 SLM.

Figure 3:
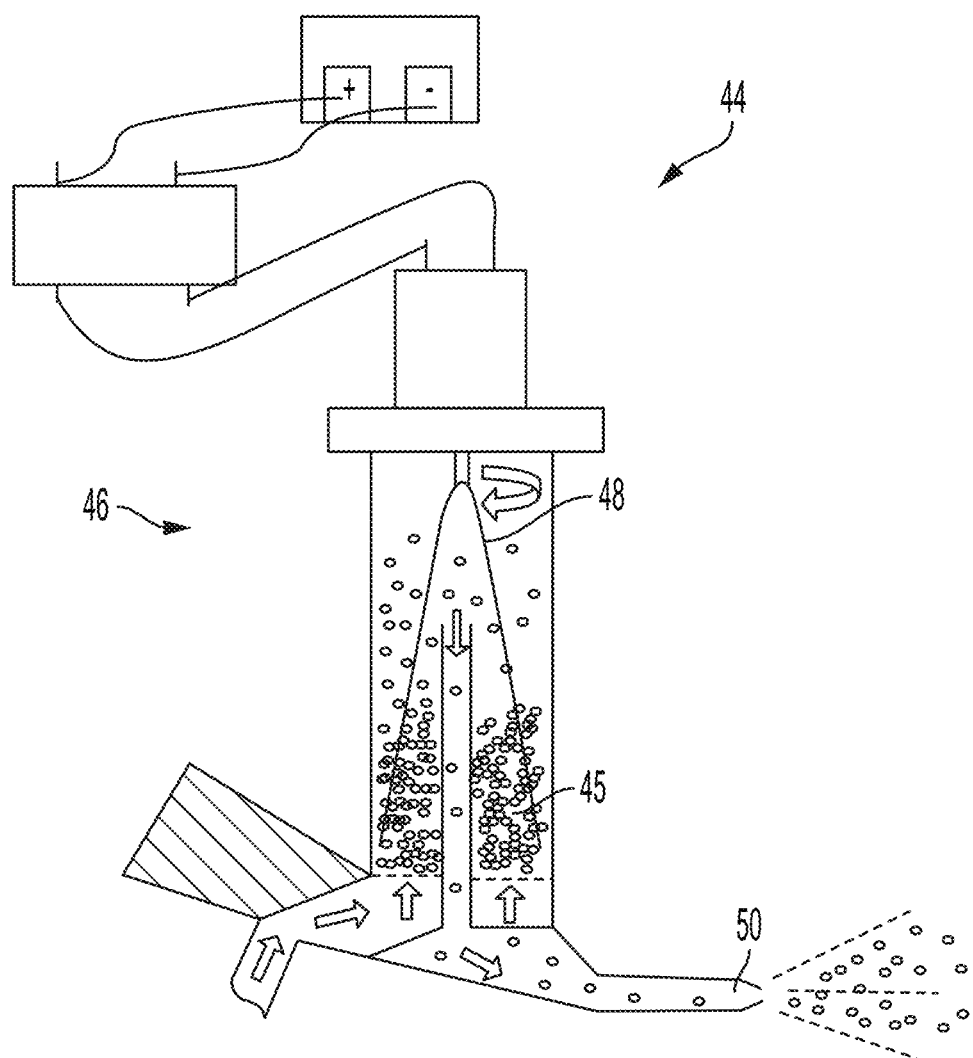
FIG. 3 Schematic depiction of an exemplary particle injector of the flow type.
Figure 6A:
FIG. 6(a) Shows material exiting the exit port of the reactor tube where only Cu NPs are injected without fuel indicating that NPs flow upward but do not form a sock.
Figure 6B:
FIG. 6(b) shows sock formation achieved from injection of Cu NPs with fuel with the sock exhibiting a brown tinge.
Figure 6C:
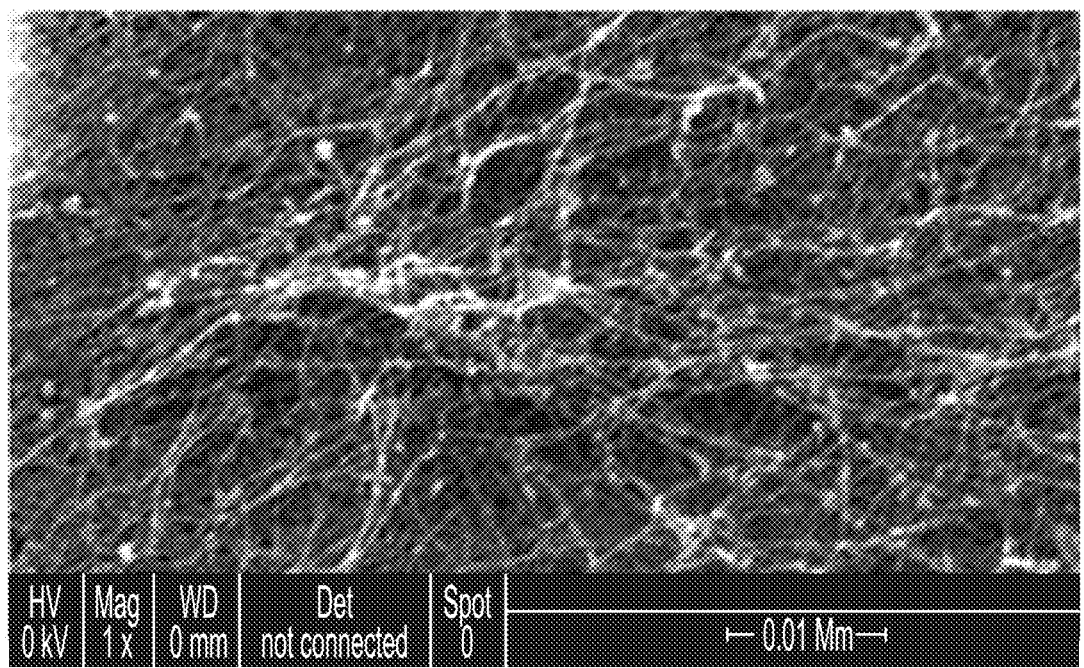
FIG. 6(c) SEM image of material resulting from injection of Cu NPs with fuel at 10,000×demonstrating overall small concentration of Cu particles among the CNT.
Figure 7A:
FIG. 7(a) Shows black CNT sock exiting the reaction after injection of fuel only.
Figure 7B:
FIG. 7(b) shows a CNT-Cu brown sock exiting the reactor after Cu NP+fuel injection, the sock is "floating" in air and although Cu concentration is small, Cu NPs have a large surface area giving the sock a Cu-like appearance.
Figure 7C:
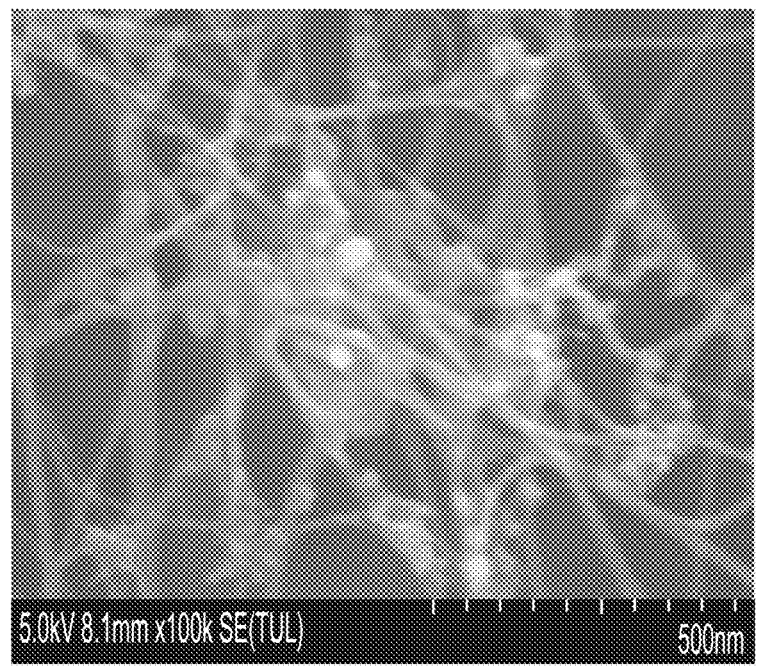
FIG. 7(c) SEM of material with injection of Cu NPs coated with 25 nm C.
Figure 7D:
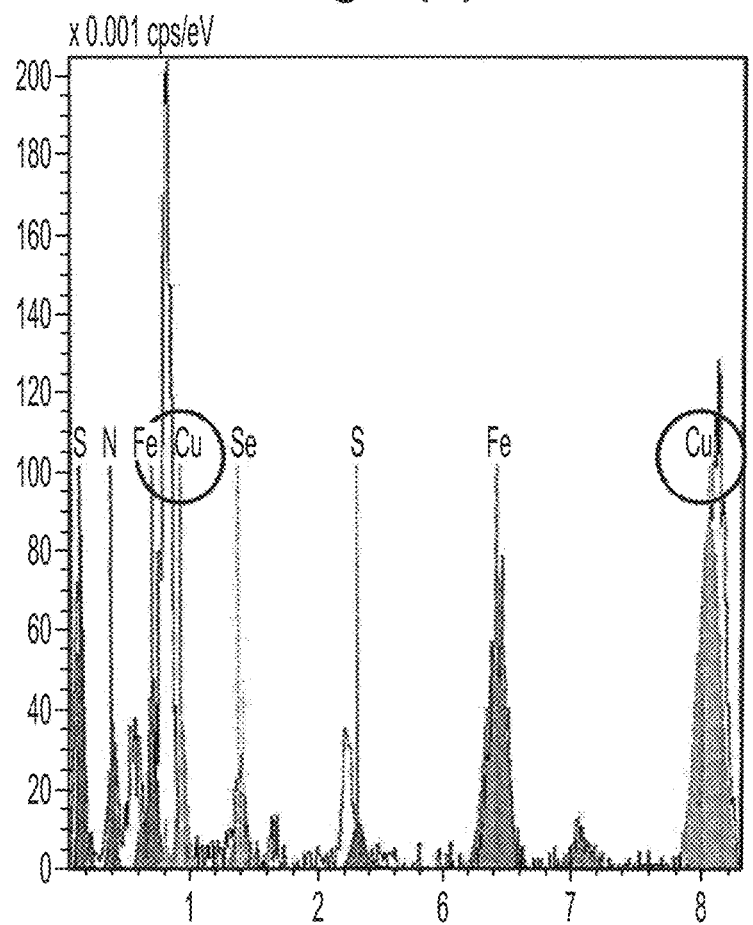
FIG. 7(d) EDX (energy dispersive x-ray) showing Cu content (circles) with CNT.
Figure 9A:
FIG. 9(a) Photograph of aluminum film for CNF coating.
Figure 9B:
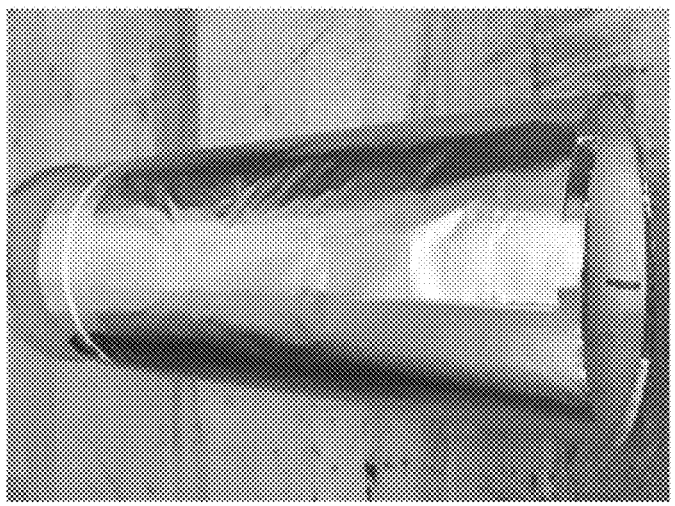
FIG. 9(b) aluminum film wrapped on drum.
Figure 9C:
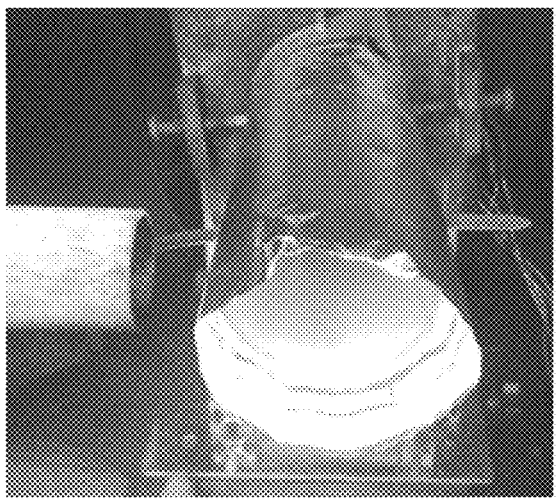
FIG. 9(c) drum at reactor exit port prior to injection.
Figure 9D:
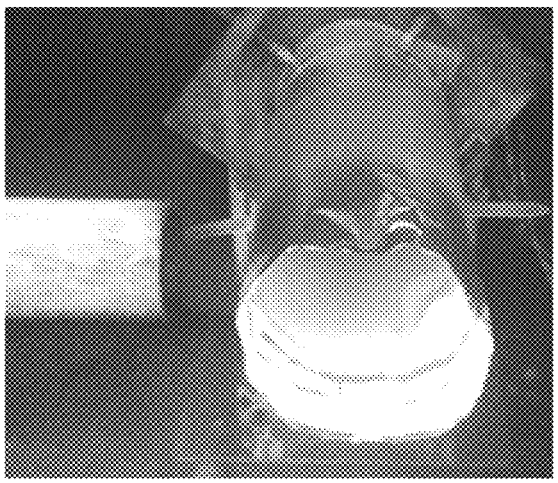
FIG. 9(d) drum showing CNF coating formed during spraying of CNF at 15 kV voltage on the drum.
Figure 10A:
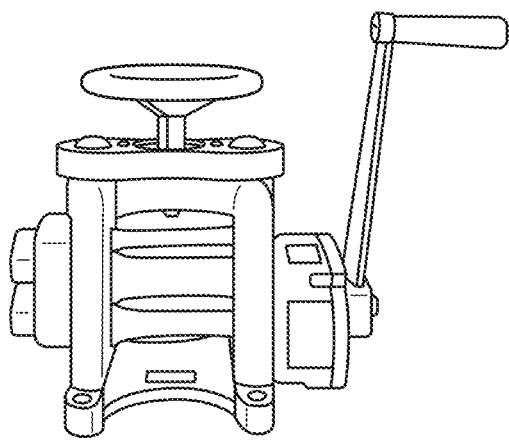
FIG. 10(a) Illustration of an exemplary rolling mill for compacting CNT-hybrid sheets.
Figure 10B:
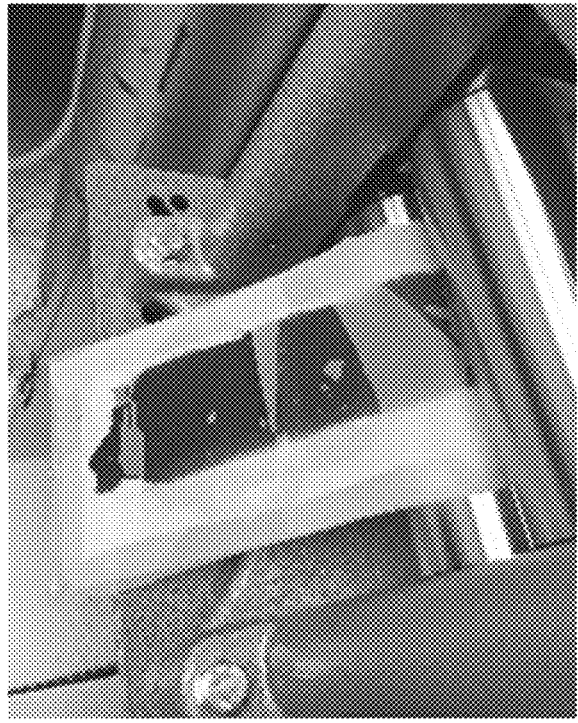
FIG. 10(b) shows rolling a CNT sheet between a Teflon backing sheet (other backing sheets are also used)
Figure 10C:
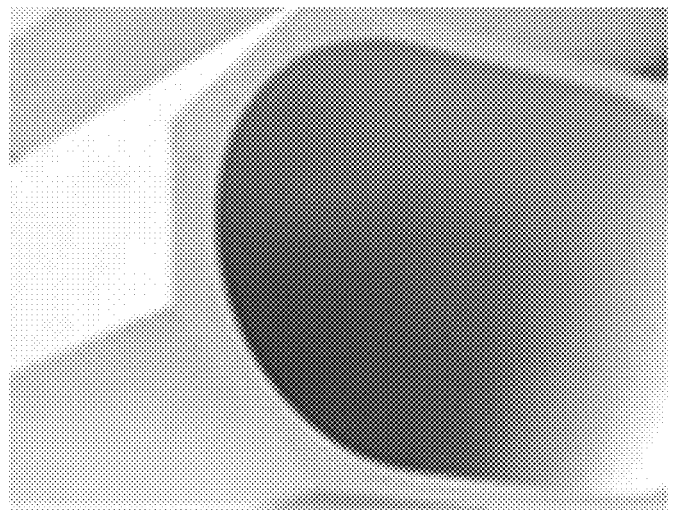
FIG. 10(c) shows different reactor tube aspects having surface area:volume ratio=2 for sock formation.
Figure 11A:
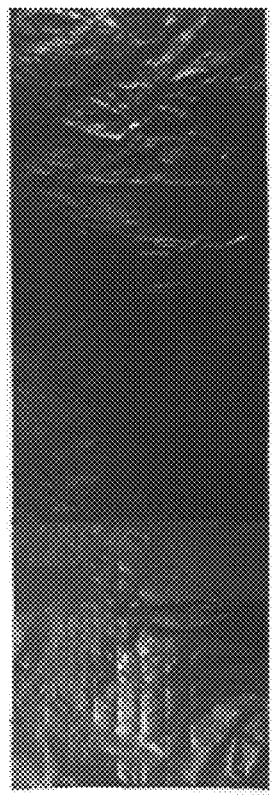
FIG. 11(a) and FIG. 11(b) photographs of GPA-produced CNT-Al sheet 5 in long by 1.5 in wide by 0.003 in thick, Al is 0.0008 in thick, CNT 0.0022 in thick, mass=0.36 g, V=0.37 cc, density 1 g/cc; after densification, specific conductivity and specific ampacity should exceed Cu.
Figure 11B:
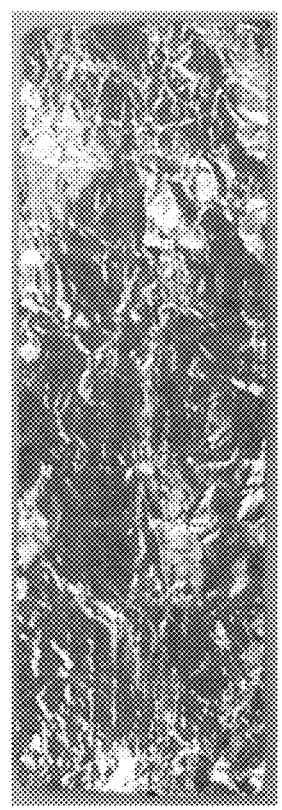
Figure 11C:
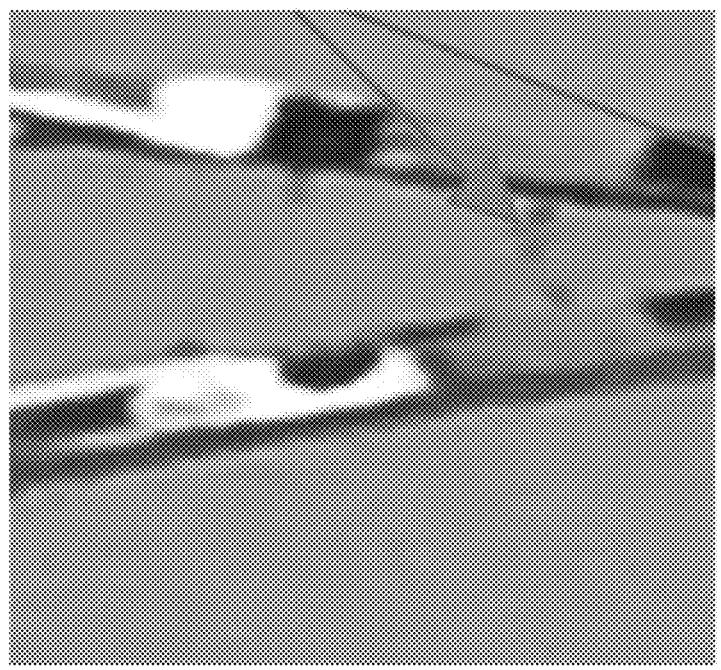
FIG. 11(c) shows double cantilever beam test with a 4-ply CNT yarn stitched & CNT sheet glass fabric composite, the composite provides electrical conductivity in-plane and through the thickness, and strengthens the composite against shear failure.

Cu Nanoparticles (NPs) are injected into the reactor tube utilizing a novel particle injection system as depicted schematically in FIG. 3. The results are depicted in FIGS. 6 and 7 and experimentally verify the novel GPA technique. The volume fraction of Cu particles may be increased to increase the conductivity of the CNT sheet. FIG. 7(a) shows a standard black CNT sock exiting the nanotube reactor; FIG. 7(b) shows a CNT-Cu brown sock exiting the reactor with Cu NP injection; FIG. 7(c) shows Cu NPs integrated into the CNT material, FIG. 7(d) shows Cu is present chemically.

Upon exiting the reactor tube, CNT-Cu hybrid sock is collected onto a spool and spun into wire. Conductivity, ampacity, strength, and modulus of CNT-Cu wire relative to Cu wire are determined. CNTs and Cu are combined in the high temperature synthesis process to produce a new high amperage electrical conductor. The percentage of Cu integrated into the CNT material is readily adjustable and different CNT-Cu materials can be custom designed for specific applications by programming the concentration of each component material into the system controller. Generally, CNT-Cu-metal wire possesses higher electrical conductivity than CNT yarn alone, and higher ampacity than Cu alone. The metal is used to enable Cu to wet the CNT. As an example, CNT-Ag—Cu platelets increase the electrical conductivity and reduce the electrical anisotropy of CNT sheet.

High ampacity and high conductivity are difficult to achieve in a single material. This is because high ampacity requires a strongly bonded system, whereas high conductivity requires free electrons from a weakly bonded system. The integration of CNT and Cu/alloy into a hybrid material overcomes this problem. Other CNT-Cu composites are known (see, e.g. Lekawa-Raus et al. *Electrical properties of carbon nanotube based fibers and their future use in electrical wiring*, Advanced Functional Materials 24, pp. 3661-3682 (2014)), however the production methods are much different, and yield a different product. Previous methods do not truly integrate the Cu at a nanoscale level; rather they rely on coating, compaction, and liquid phase mixing. For example, Lekawa-Raus flattens a CNT forest into a sheet and electroplates it with Cu. The material exhibits an electrical conductivity of 2.3 to $4.7 \times 10^5$ S/cm (Cu conductivity is $5.8 \times 10^5$ S/cm) and ampacity of $6 \times 10^8$ A/cm$^2$ (Cu ampacity is $6.1 \times 10^6$ A/cm$^2$).

In contrast, GPA according to the instant methods is a novel and scalable method to integrate Cu/alloy into CNT at the nanoscale level to form electrical wire having high conductivity potentially without as high of volume fraction of Cu because the Cu is integrated throughout the CNT material, and not deposited merely on the surface.

Strength of wire is also a consideration and the floating catalyst method has produced the strongest CNT yarn reported in the literature. GPA, however, is the only method to-date where Cu or other components are introduced during the high temperature CNT synthesis process resulting in the production of continuous CNT-hybrid electrical cable in one assembly line where the Cu is integrated within nano-voids between CNT. A rolling mill may be used to densify the material.

The conductivity of raw CNT yarn is $2 \times 10^6$ S/m at 150° C. Although comprehensive study of the novel CNT-Cu material is underway, CNT sheet conductivity is predicted to increase in the CNT-Cu/alloy yarn to as high as $10 \times 10^6$ S/m. The density of hybrid yarn is estimated to be between 1-4 g/cc. The specific conductivity of CNT hybrid yarn is estimated to be about $5 \times 10^6$ (S/m)/(g/cc), which is greater than the specific conductivity of Cu. Ampacity of the hybrid yarn is estimated to be about 10 times greater than for Cu wire considering the effect of CNT junctions in the wire. The CNT-Cu/alloy hybrid is predicted to be more fatigue and corrosion resistant, and stronger than Cu alone.

According to the Cu—C phase diagram, there are no chemical compounds between the two elements. In addition, the solubility of carbon in Cu is very low—about 0.008 weight % at 1084° C. This implies that chemically bonding Cu with C should be challenging. Several approaches for manufacture of CNT-Cu hybrid yarns have been previously explored but GPA offers a different approach that integrates melted NPs within the CNT bundle voids during the synthesis process to increase the surface area of the contact which reduces the resistance between adjacent CNTs. In addition, hybrid C—Cu/alloy structures may be thermally treated in an Ar/H$_2$ atmosphere at 50° C. below the melting point of Cu to provide Rapid Thermal Annealing (RTA) to make the contacts between the Cu alloy and CNTs more "ohmic".

Example 2

This Example illustrates production of a specific embodiment of a CNT-Al sheet.

A CNT-Al laminated sheet is produced by an embodiment of the inventive GPA pyrolytic reactor system. The production parameters are as follows:
(i) Ar flow rate to fuel injector 1200 SCCM;
(ii) no particle injection, pristine sheet;
(iii) Hydrogen shroud gas flow rate 100 SCCM;
(iv) fuel injector fuel flow rate 30 ml/hr;
(v) furnace zone temperature 1400° C.;
(vi) no particle injection;
(vii) fuel injector position from furnace zone, 14 inches;
(viii) Ar dilution gas flow rate into harvest box, 2 SLM.

Additionally, post processing comprised pressing the CNT sheet onto Al foil; sheet was 5 in long by 1.5 in wide by 0.003 in thick, Al was about 0.0008 in thick, CNT was about 0.0022 in thick, mass=0.36 g, V=0.37 cc, density about 1.4 g/cc.

Example 3

This Example illustrates production of a specific embodiment of a CNT-(Ag-coated Cu) sheet.

A CNT-(Ag-coated Cu) sheet is produced by an embodiment of the inventive GPA pyrolytic reactor system. The production parameters are as follows:
(i) Ar flow rate to fuel injector 1200 SCCM;
(ii) Ar flow rate to particle injector 800 SCCM;
(iii) Hydrogen shroud gas flow rate 100 SCCM;
(iv) fuel injector fuel flow rate 30 ml/hr;
(v) furnace zone temperature 1400° C.;
(vi) particle type 10 micron size, 100 nm thick Ag coated Cu platelet;
(vii) fuel injector position from furnace zone, 14 inches;
(viii) particle injector position from furnace zone, 2 inches;
(ix) Ar dilution gas flow rate into harvest box, 2 SLM.

Example 4

This Example illustrates production of a specific embodiment of a CNT-Si sheet.

A CNT-Si sheet is produced by an embodiment of the inventive GPA pyrolytic reactor system. The production parameters are as follows:
(i) Ar flow rate to fuel injector 1200 SCCM;
(ii) Ar flow rate to particle injector 800 SCCM;
(iii) Hydrogen shroud gas flow rate 100 SCCM;
(iv) fuel injector fuel flow rate 30 ml/hr;
(v) furnace zone temperature 1400° C.;
(vi) particle type 10 micron size;
(vii) fuel injector position from hot zone, 14 inches;
(viii) particle injector position from hot zone, 2 inches;
(ix) Ar dilution gas flow rate into harvest box, 2 SLM.

CNT-Si composites produced by other methods have been utilized for fabrication of an electrode; however these composites are expensive. A scalable, cost-efficient process for the production of high quality CNT-Si is heretofore unknown. It may readily be envisioned by a person of skill in the art that CNT-Si materials produced according to the disclosed methods provide a superior solution to the cost-effective production of electrodes, e.g. anodes for Li batteries.

Example 5

This example illustrates production of a specific embodiment of a CNT-Fe sheet.

A magnetic CNT-Fe yarn or sheet is produced by an embodiment of the inventive GPA pyrolytic reactor system. The production parameters are as follows:
(i) Ar flow rate to fuel injector 1200 SCCM;
(ii) Ar flow rate to particle injector 800 SCCM;
(iii) Hydrogen shroud gas flow rate 100 SCCM;
(iv) fuel injector fuel flow rate 30 ml/hr;
(v) furnace temperature 1400° C.;
(vi) particle type ferrocene powder in the particle injector alone or with other particles; (vii) fuel injector position from hot zone, 14 inches;
(viii) particle injector position from hot zone, 2 inches;
(ix) Ar dilution gas flow rate into glove box, 2 SLM.

Example 6

This Example illustrates design and production of a composite multifunctional material.

Generally, Multifunctional composites with increased in-plane electrical conduction are produced by integrating CNT hybrid sheet between the plies in a composite to increase electrical conduction, and multifunctional composites with increased in-plane shear are produced by stitching CNT hybrid yarn between the plies in a composite to increase interlaminar shear and $G_{1C}$ fracture toughness and electrical conduction through the thickness of the composite.

Fiber-reinforced polymer (FRP) composite materials are an attractive alternative to metals as structural components and are widely used in the aerospace and sports industries where lightweight, stiff materials are paramount. Multifunctional composites that combine the desirable mechanical properties of existing FRPs with other properties (such as conductivity) are of particular interest as even further weight reductions can be gained by combining multiple systems into one smart material. The two-phase nature of FRP materials (stiff, hard reinforcement phase and softer, binding matrix phase) combined with their laminated structure renders them prone to both de-bonding between the reinforcement and matrix phases, and delamination between the composite layers. As a result, any attempts to add multi-functionality to FRPs must not contribute to early failure by either of these (or by any other) mechanisms. Because of their extremely high conductivity and aspect ratio, CNTs are capable of drastically increasing the conductivity of FRPs at very low volume fractions which makes CNT reinforcement of FRPs a promising avenue towards lightweight, multifunctional materials.

Indeed, many attempts have been made to incorporate loose CNTs into FRPs; however, because of the high van der Waals attraction between the nanotubes, they tend to form aggregates when mixed into the matrix which increases viscosity and decreases the properties of the composite. An alternative that alleviates the problem of aggregation while still contributing to multi-functionality is to use CNT sheet and yarn. Because they can be continuously drawn during manufacturing, CNT sheets and yarns offer the best opportunity to add multi-functionality to FRP materials in a scalable and easily industrialized manner. Laminated FRP materials that have been reinforced with CNT sheets in the interlaminar regions have shown significant increases in both interlaminar shear strength and in-plane conductivity. The CNT sheets are prepared separately from the other composite components and are stacked to achieve the desired thickness and orientation, and are then placed between two laminae. The CNT sheets create a continuous electrical pathway in the plane of the composite, but the through-thickness conductivity remains a challenge as the thin nanotube sheets placed in between the lamina are not able to penetrate through the fiber mats and make large-scale electrical contact in the through-thickness direction.

Stitching with CNT yarn is a solution for increasing the through-thickness conductivity of FRPs while simultaneously increasing the Mode I fracture toughness, $G_{Ic}$. Attempts to mitigate the delamination of FRPs with stitching have been practiced since the early 1980s. There are notable drawbacks, however, such as the introduction of resin-rich regions around the stitches and the misalignment and warping of the fibers around stitches—both of which can reduce the tensile strength and modulus of the composite. Because CNT yarn maintains its strength even under extreme distortion, the yarn can easily intercalate between the fibers in the FRP without losing its strength. Additionally, because the stiches run vertically through the thickness of the composite, the conductivity in the through-thickness direction could be significantly increased by stitching with CNT yarn.

Embodiments of the invention provide CNT-hybrid yarns designed to confer very specific properties to the FRP materials.

Example 7

This Example illustrates design and production of a water filtering material constructed from an exemplary CNT-GAC yarn and sheet material.

CNT materials have been widely studied as candidate material for water and air filtration. CNT materials can be used as grown or functionalized to filter a wide variety of pollutants. However, manufacturing and cost factors prevent have prevented commercial use of CNT in filters. With the progress in CNT manufacturing such as the catalytic chemical vapor deposition in a fluidized bed, the cost is reducing. Another approach is novel packing of the CNT material for high efficient use. The CNT filtration media with varying porosity in a stratified structure may have improved filtration efficiency as compared uniformly structured filters. The porosity decreases from top to bottom of the filter, reducing the chance of clogged surface layer. Proper manufacturing and post processing of CNT yarn is the key to make such a stratified filter structure. In filtering, larger particles may plug a fine pore filter, and smaller particles may pass through a coarse pore filter. Thus a graded porosity filter is appropriate for some applications.

By using embodiments of the inventive GPA process, conventional filter material such as granulated activated carbon (GAC) is integrated with CNT. The hybrid filter media exhibits improved efficiency, capacity and may target a wider spectrum of contaminants, including, for example, lead. Since the CNT-GAC filter is electrically conductive, ionic filtering is also possible.

Example 8

This Example illustrates production of CNT-SMC materials according to specific embodiments of the invention.

Somaloy ferromagnetic iron particles are dispersed uniformly in epoxy resin to form a soft magnetic composite (SMC) material. Measurements of the electrical conductivity, permittivity, and permeability indicate that the composite can be a good candidate for an insulating substrate with negligibly small eddy-current loss and sufficiently high permittivity. CNT sheet is then formed as a nanoskin, which increases the Transverse Rupture Strength (TRS) of the material, enabling its use in structural and dynamic applications without significantly altering its properties. CNT sheet is wrapped on the outside of materials to add strength and conductivity. The CNT sheet may be laminated with Ultem™ high temperature epoxy as a nanoskin on the SMC.

Example 9

The following is a prophetic example illustrating production of CNT-BNNT material and Piezoelectric material.

Boron nitride nanotubes (BNNT) are a cousin to CNT and are similar diameter and length to double wall CNT. BNNT have greater van der Waals forces than CNT. Thus BNNT can be injected into the process to produce CNT hybrid material that has unique properties of neutron shielding, high temperature resistance, BNNT are electrically insulating and peizoelectric in bundles.

ZnO nanowires (NW) currently in the literature are used in a forest with electrodes on the top and bottom of the NWs. This design, however, is time consuming to fabricate. GPA cannot produce a forest of NWs. Thus a different approach is provided that is scalable. GPA according to embodiments of the invention is utilized to produce a CNT sheet with ZnO NWs, or BNNT in the plane of the sheet. This sheet is then post processed (rolled and densified) and then electroded using inter-digitated electrodes (IDE) in a photo-lithography process. This design enables large sheets of the material to be produced. The effective d (piezoelectric) coefficient (m/v) of the material is determined and is in the range of about ½₀ of led zirconate titinate materials. However, since the area of the sheet material can be very large in structures, significant charge can be produced for use as a sensor or low authority actuator. A large electric field is applied to align the piezoelectric fibers in the GPA process, and the sheet is stretched to align the piezo fibers (ZnO or BNNT). If the piezo fibers are not aligned, the material will act as an unpoled ceramic and the net piezo effect will be zero. IDE electrodes actuate piezo fibers in the load direction.

A person of ordinary skill in the art will understand that specific attributes of the Gas Phase Assembly system and method may be altered or adapted without departing from the spirit nor limiting the scope of the instant invention as defined by the claims. The scope of the present invention is not intended to be limited to the above Description or to the illustrative examples, but rather is as set forth in the appended claims. Articles such as "a", "an" and "the" may mean one or more than one unless indicated to the contrary or otherwise evident from the context. Claims or descriptions that include "or" between one or more members of a group are considered satisfied if one, more than one, or all of the group members are present in, employed in, or otherwise relevant to a given product or process unless indicated to the contrary or otherwise evident from the context. The invention includes embodiments in which exactly one member of the group is present in, employed in, or otherwise relevant to a given product or process. The invention also includes embodiments in which more than one, or all of the group members are present in, employed in, or otherwise relevant to a given product or process. Furthermore, it is to be understood that the invention encompasses all variations, combinations, and permutations in which one or more limitations, elements, clauses, descriptive terms, etc., from one or more of the listed claims or from the description above is introduced into another claim. For example, any claim that is dependent on another claim can be modified to include one or more elements, limitations, clauses, or descriptive terms, found in any other claim that is dependent on the same base claim. It should also be understood that, in general, where the invention, or aspects of the invention, is/are referred to as comprising particular elements, features, etc., certain embodiments of the invention or aspects of the invention consist, or consist essentially of, such elements, features, etc.

The invention claimed is:

1. A gas-phase method for the production of carbon nanotube (CNT)-hybrid yarn and sheets using a pyrolytic reactor tube comprising an inlet port, an inlet zone, a furnace zone, an exit zone, and an exit port, the method comprising:

delivering an atomized fuel flow to the furnace zone at a point proximate the inlet port at a fuel flow rate, said fuel flow comprising a carrier gas and at least one source of carbon;

delivering a particle flow to the furnace zone at a point in the inlet zone at or beyond the delivery point of the fuel flow at a particle flow rate, said particle flow comprising carrier gas and at least one particle selected from ceramic, polymer, metal, a carbon source, and combinations thereof;

independently controlling the fuel flow rate and the particle flow rate to achieve a production time sufficient to continuously form a CNT-hybrid sock at a furnace zone temperature of between 1200° C. and 1600° C.;

and collecting the emerging CNT-hybrid sock in a harvest box;

wherein the collected CNT-hybrid sock comprises carbon nanotube bundles integrated with the injected particles.

2. The method according to claim 1, wherein the furnace zone temperature is maintained at about 1400° C. across the production time.

3. The method according to claim 1, further comprising twisting the emerging CNT-hybrid sock into yarn or rolling the emerging CNT-hybrid sock into sheets.

4. The method according to claim 3, wherein the twisting and/or rolling is accompanied by one or more of water densification and electric charging.

5. The method according to claim 4, wherein the emerging CNT-hybrid sock is wound onto a rolling drum partially submerged in a water bath.

6. The method according to claim 5, wherein the CNT-hybrid sock is rolled with a backing sheet, tape or fiber.

7. The method according to claim 6, wherein the backing sheet comprises
polytetrafluoroethylene.

8. The method according to claim 1, wherein the fuel flow and/or the particle flow comprises at least one catalyst.

9. The method according to claim 8, wherein the catalyst comprises ferrocene.

10. The method according to claim 8, wherein the fuel flow further comprises thiophene.

11. The method according to claim 8, wherein the fuel flow further comprises xylene.

12. The method according to claim 1, wherein the fuel flow carbon source comprises a $C_{1-6}$ hydrocarbon, optionally as an alcohol.

13. The method according to claim 1, wherein the fuel flow comprises a carbon source and the particle flow comprises particles selected from the group consisting of Li, Na, K, Mg, Ca, Ba, Ti, Zr, Nb, Cr, Ni, Pd, Cu, Al, Ag-coated Cu, Si, granulated activated carbon, granulated activated carbon and ferrocene, powder CNT, boron nitride nanotubes, C-60, nitinol, Cu—Ni alloy, Fe, and gaseous $C^{13}$.

14. The method according to claim 1, wherein the particles comprise a nanopowder.

15. The method according to claim 14, wherein the particles comprise a functional group selected from the group consisting of —OH, —COOH, —CHO, —X (F, Cl, Br, I), $N_2$, epoxide, and a combination of two or more thereof.

16. The method according to claim 1, wherein the carrier gas comprises Argon.

17. The method according to claim 1, wherein there is no independent fuel flow and particles comprising a high aspect ratio carbon are injected from a particle injector.

18. The method according to claim 17, wherein the high aspect ratio carbon particles are selected from the group consisting of carbon nanotubes, carbon nanofibers, carbon microfibers, and C-60.

19. The method according to claim 18, wherein one or more non-carbon particles are mixed with the high aspect ratio carbon particles in a particle injector, or delivered into the reactor inlet by different particle injectors.

20. The method according to claim 1, wherein to achieve continuous product the fuel flow rate is adjusted to between 10 ml/hr and 60 ml/hr, and the particle delivery rate is roughly adjusted to between 1 g/hr and 100 g/hr for a 2 inch outer diameter reactor tube.

21. The method according to claim 1, wherein hydrogen exhaust gas generated in the furnace is vented through one or more openings in the exit port to a hood at least partially surrounding the exit port, and through a conduit in communication with a first bubbler located exterior to the harvest box.

22. The method according to claim 21, wherein hydrogen gas present in the harvest box is vented via a conduit from the harvest box to a second bubbler situated exterior to the harvest box.

23. The method according to claim 1, further comprising delivering a dilution gas flow into the harvest box at a dilution gas flow rate of from about 2 SLM to about 15 SLM.

24. The method according to claim 1 wherein hydrogen exhaust gas generated in the furnace is vented through one or more openings in the exit port to a hood at least partially surrounding the exit port, and through a conduit in communication with a first bubbler located exterior to the harvest box, hydrogen gas present in the harvest box is vented via a conduit from the harvest box to a second bubbler situated exterior to the harvest box, said first bubbler at a pressure of about 0.5 inches of water, said second bubbler at a pressure of about 1.0 inches of water and further comprising a dilution gas flow into the harvest box at a dilution gas flow rate of from about 2 SLM to about 15 SLM.

25. The method according to claim 1, wherein delivering a particle flow comprises injecting particles via at least one particle injector selected from the group consisting of a flow type injector, a venturi eductor, and combinations thereof, wherein prior to delivering the particle flow, the particles are mixed with the carrier gas in the at least one injector.

26. The method according to claim 25, wherein particles are delivered from at least two different particle injectors, each particle injector comprising a different particle.

27. The method according to claim 1, wherein delivering an atomized fuel flow and delivering a particle flow are effectuated via a dual injection device comprising a first nozzle and a second nozzle that meet at a merged injection outlet, the first nozzle providing carrier gas and particles at a first flow rate, the second nozzle providing fuel at a second flow rate via a positive displacement pump, whereby the first flow rate and the second flow rate are independently controlled.

28. The method according to claim 27, wherein the positive displacement pump comprises a syringe.

29. The method of claim 27, wherein a voltage between about −20 kV and +3 kV is applied to the duel injection device during a production time.

30. The method according to claim 1, further comprising applying an electromagnetic field to the reactor during the production time.

31. A carbon nanotube (CNT)-NP hybrid material having NPs integrated into the material at a nanoscale level, wherein the CNT-NP hybrid material is formed from a continuous CNT-NP hybrid sock.

32. A filter comprising a CNT-NP hybrid material having NPs integrated into the material at a nanoscale, the filter comprising a porosity defined by pore size and pore density, the CNT-NP hybrid material comprising CNT bundles integrated with one or more of the NPs, the NPs being selected from granulated activated carbon and iron, wherein the CNT-NP hybrid material is formed from a continuous CNT-NP hybrid sock.

33. The filter according to claim 32, wherein the filter pore size and density are uniform.

34. The CNT-NP hybrid material according to claim 31 comprising a CNT-Cu wire.

35. The CNT-NP hybrid material according to claim 31 comprising CNT-Al sheet.

36. The CNT-NP hybrid material according to claim 31 comprising CNT-(Ag-coated-Cu) sheet.

37. The CNT-NP hybrid material according to claim 31 comprising CNT-Si sheet.

38. The CNT-NP hybrid material according to claim 31 comprising a magnetic CNT-Fe material.

39. The CNT-NP hybrid material according to claim 31 comprising CNT-nitinol sheet.

40. The CNT-NP hybrid material according to claim 31 comprising CNT-Y—X, wherein Y is selected from carbon nanofiber (CNF) and carbon microfiber (CMF), and X is selected from the group consisting of Li, Na, K, Mg, Ca, Ba, Ti, Zr, Nb, Cr, Ni, Pd, Cu, Al, Ag-coated Cu, Si, granulated activated carbon, granulated activated carbon and ferrocene, powder CNT, boron nitride nanotubes, C-60, nitinol, Cu—Ni alloy, Fe, and gaseous $C^{13}$.

41. The CNT-NP hybrid material according to claim 31 comprising a CNT-X material, wherein X is selected from the group consisting of Li, Na, K, Mg, Ca, Ba, Ti, Zr, Nb, Cr, Ni, Pd, Cu, Al, Ag-coated Cu, Si, granulated activated carbon, granulated activated carbon and ferrocene, powder CNT, boron nitride nanotubes, C-60, nitinol, Cu—Ni alloy, Fe, gaseous $C^{13}$, rubidium, cesium, and francium.

42. The CNT-NP hybrid material according to claim 41, wherein X is selected from the group consisting of lithium, sodium, potassium, rubidium, cesium, francium, and a combination of two or more thereof, and, prior to removal from the harvest box, the CNT-X material is coated with a dielectric coating.

43. The CNT-NP hybrid material according to claim 31, wherein the CNT-NP hybrid material comprises a plurality of nano-voids between adjacent CNT, at least one of the plurality of nano-voids containing at least one NP.

* * * * *

UNITED STATES PATENT AND TRADEMARK OFFICE
CERTIFICATE OF CORRECTION

| | |
|---|---|
| PATENT NO. | : 11,305,998 B2 |
| APPLICATION NO. | : 16/488379 |
| DATED | : April 19, 2022 |
| INVENTOR(S) | : Mark Schulz et al. |

It is certified that error appears in the above-identified patent and that said Letters Patent is hereby corrected as shown below:

On the Title Page

Item (72), inventor 4, insert --Devika Chauhan, Cincinnati, OH (US)--.

Item (72), inventor 5, insert --Vesselin Shanov, Cincinnati, OH (US)--.

Item (72), inventor 6, insert --Svitlana Fialkova, Jamestown, NC (US)--.

Item (72), inventor 7, insert --Sergey Yarmolenko, Chapel Hill, NC (US)--.

In page 2, Column 2, item (56), other publications, cite no. 1, delete "Ecole cnetrale Paris" and insert --Ecole centrale Paris--, therefor.

In the Specification

In Column 4, Line(s) 64, delete "hulk" and insert --bulk--, therefor.

In Column 11, Line(s) 7, delete "dialetric" and insert --dielectric--, therefor.

In Column 16, Line(s) 11, delete "dialetric" and insert --dielectric--, therefor.

In Column 16, Line(s) 15, delete "(>10' ¹)" and insert --(>10⁶)--, therefor.

In Column 17, table 3, particle species-Cu, downstream applications, delete "soluable" and insert --soluble--, therefor.

In Column 26, Line(s) 16, delete "led zirconate titinate" and insert --lead zirconate titanate--, therefor.

Signed and Sealed this
Thirteenth Day of December, 2022

Katherine Kelly Vidal
*Director of the United States Patent and Trademark Office*